(12) United States Patent
Lin

(10) Patent No.: US 7,071,750 B2
(45) Date of Patent: Jul. 4, 2006

(54) METHOD FOR MULTIPLE-PHASE SPLITTING BY PHASE INTERPOLATION AND CIRCUIT THE SAME

(75) Inventor: Roger Lin, Hsin-Tien (TW)

(73) Assignee: VIA Technologies Inc., Hsin-Tien (TW)

( * ) Notice: Subject to any disclaimer, the term of this patent is extended or adjusted under 35 U.S.C. 154(b) by 0 days.

(21) Appl. No.: 10/680,150

(22) Filed: Oct. 8, 2003

(65) Prior Publication Data

US 2005/0001665 A1 Jan. 6, 2005

(51) Int. Cl.
*H03K 5/13* (2006.01)

(52) U.S. Cl. .................. 327/251; 327/238; 331/45; 331/57

(58) Field of Classification Search ............... 327/238; 331/57, 45
See application file for complete search history.

(56) References Cited

U.S. PATENT DOCUMENTS

| | | | |
|---|---|---|---|
| 6,114,914 A * | 9/2000 | Mar ............................. | 331/16 |
| 6,194,947 B1 * | 2/2001 | Lee et al. .................... | 327/359 |
| 6,259,326 B1 | 7/2001 | Dunlop et al. | |
| 6,369,661 B1 * | 4/2002 | Scott et al. .................... | 331/45 |
| 6,380,774 B1 * | 4/2002 | Saeki .......................... | 327/119 |
| 6,392,462 B1 | 5/2002 | Ebuchi et al. | |
| 6,525,615 B1 * | 2/2003 | Masenas et al. .............. | 331/34 |
| 2002/0174374 A1 * | 11/2002 | Ghaderi et al. ............. | 713/500 |

* cited by examiner

*Primary Examiner*—Timothy P. Callahan
*Assistant Examiner*—An T. Luu
(74) *Attorney, Agent, or Firm*—Winston Hsu

(57) ABSTRACT

The invention relates to a method and related circuitry for multiple phase-splitting. The method includes: while generating M output clocks with a same frequency f1 and different phases, generating N reference clocks with a same frequency (M/N)*f1 and different phases (wherein M>N), and triggering (N/M) frequency division using different periods within each reference clock to generate (M/N) output clocks of different phases for each reference clock, such that the M output clocks of different phases are generated from the N reference clocks of different phases.

19 Claims, 17 Drawing Sheets

METHOD FOR MULTIPLE-PHASE SPLITTING BY PHASE INTERPOLATION AND CIRCUIT THE SAME

BACKGROUND OF INVENTION

1. Field of the Invention

The present invention relates to a method and a related circuit for phase splitting, and more specifically, to a method and a related circuit for phase splitting by phase interpolation according to multi-phase reference clocks.

2. Description of the Prior Art

In the modern information-oriented society, electronic apparatuses for processing and storing digital information require higher operating speeds and higher circuit densities. Accordingly, the precision of circuit control and operation becomes important. For instance, the timing control of a CD-ROM drive requires precise management. Although a CD-ROM drive can analyze light reflected from a CD to find a clock for synchronous time control, it requires a clock period to be divided into a plurality of different time points in order to control data write/access precisely. In addition, devices such as a time-to-digital converter (TDC) or a time delay calibration circuit also require clocks in different phases in order to divide the clock period into many time points. Therefore, a multiple phase generating circuit capable of dividing one clock into several clocks with the same frequency but different phases becomes indispensable.

In the prior art, clocks of the same frequency but different phases can be provided by each stage of inverters in a ring oscillator. Assuming that 16 clocks of the same frequency but different phases are required, and the phase difference of the clocks is distributed over 360 degrees, in the prior art, 8 differential inverters are needed in a ring oscillator so that 16 clocks of the same frequency but different phases can be provided at the two outputs of each inverter. Please refer to the FIG. 1 showing a ring oscillator 10 according to the prior art. The oscillator 10 has 8 inverters 12A–12H connected in a ring with two differential inputs and two differential outputs each. For instance, the inverter 12A receives two inverse outputs from the differential output s of the inverter 12H via its differential inputs, and the two inverse outputs from the differential outputs of the phase inverter 12A are inputted into the differential inputs of the inverter 12B. In such a manner 16 output clocks A-H, Ai-Hi of the same frequency but different phases can be generated by collecting the outputs from the differential outputs of the inverters 12A–12H. As shown in FIG. 1, the differential outputs of the inverter 12A generate output clocks B, Bi, the phase inverter 12B generates output clocks C, Ci. In the same way, the phase inverter 12H generates output clocks A, Ai. Taking the output clock A as 0 degrees, the phase difference of the output clocks are shown in FIG. 1. For instance, the output clocks A, Ai are output from the differential output of the inverter 12H, thus there is a phase difference of 180 degrees between the output clock Ai and the output clock A. Similarly, there is a phase difference of 45 degrees between the output clock C and the output clock A, and there is a phase difference of 225 (=45+180) degrees between the output clock Ci and the output clock A.

Please refer to FIG. 2 showing a waveform timing diagram of the output clocks A-H, Ai-Hi. The horizontal axis represents time, and the vertical axis represents waveform amplitude. In the ring oscillator, each inverter delays a signal at its inputs by a period of time and outputs signals inversely, and by connecting the phase inverters serially, output clocks of periodical oscillation can be obtained at the outputs of the inverters. For instance in FIG. 2, the output clock A falls from high level to low level at time point tp0 (while the output clock Ai rises from low level to high level at time point tp0). After delaying the output clocks A, Ai by the phase inverter 12A, the output clock B increases from low level to high level at time point tp0+Tg (while the output clock Bi increases from low level to high level), wherein Tg means the delay time of the inverter 12A. Similarly, after the output clocks B, Bi by the inverter 12B are delayed, the level change of the clocks C, Ci will be triggered at time point tp0+2Tg (assuming that each inverter has the same delay time Tg). Eventually the phase inverter 12G will trigger the level change of the clocks H, Hi at time point tp0+7Tg, and the inverter 12H will trigger the level change of the clocks A, Ai at time point tp0+8Tg and then oscillation starts. In other word, the total delay time 8Tg is a half of the period of an output clock, and the period or the frequency of an output clock can be changed by adjusting the delay time Tg. Since the delay time 8Tg is a half of the period of an output clock, the delay time 8Tg equals to a phase difference of 22.5 degrees. For instance in the phase inverter 12A, the output clock B, by adding the delay time (22.5 degrees) to the output clock A and reversing the output phase (180 degrees), has a phase difference of 202.5 (=22.5+180) degrees relative to the output clock A. Please refer to FIG. 3 showing another waveform timing diagram of the output clocks A-H, Ai-Hi, wherein the horizontal axis represents time, and the vertical axis represents waveform amplitude as in FIG. 2. However, FIG. 3 is made in sequence of phase difference with the output clock A. As shown in FIG. 3, based on a rising edge of the output clock A (e.g. a rising edge at time point tp1), the following rising edges (e.g. rising edges of the clocks Bi, C, H at time points tp1+Tg, tp1+2Tg, tp1+15Tg) can divide a period of the output clocks equally by 16 for the purpose of precise timing control. Such kind of division is equivalent to phase splitting.

However, there are several disadvantages in prior art. First, the ring oscillator requires a plurality of inverters, but at the same time the inverters may not be matched to each other causing noise. Such noise and mismatch cause jitter in each output clock or errors in phase difference. Please refer to FIG. 4 showing a waveform timing diagram of the output clocks in FIG. 1 in non-ideal conditions, wherein the horizontal axis represents time and the vertical axis represents waveform amplitude. If jitter exists in the output clock A, the duty cycle of each period of the output clock A is unstable. For instance, in period Tp1 from time point tp3 to time point tp4, the duty cycle is 50% and the high level signal is 180 degrees. However influenced by jitter, in period Tp2 from time point tp4 to time point tp5, the duty cycle may increase and the high level signal may become 185 degrees. In addition, the period of each output clock may be changed. For instance, the time period Tp1 may be different from the time period Tp2.

Furthermore, since the ring oscillator triggers level changes of inverters alternately, if the duty cycle of the output clock is unstable, the phase difference between the output clocks becomes unstable. As shown in FIG. 4, the rising edge of the output clock A at time points tp3, tp4 triggers the falling edge of the output clock B after the delay time Tg (equivalent to a phase difference of 22.5 degrees), and then the falling edge of the output clock B triggers the rising edge of the output clock C after the delay time Tg (equivalent to a phase difference of 45 degrees). Even if the output clock A does not have an ideal duty cycle in period Tp2, rising edges of each period of the output clock C keep a phase difference of 45 degrees (equivalent to 2Tg of delay time) with rising edges of each period of the output clock A. However, the rising edge of the output clock Bi is triggered by the falling edge of the output clock A at time points tp3b, tp4b, since the output clock A has unstable duty cycles in period Tp1, Tp2, the time when the falling edge occurs of the output clock A is accordingly unstable, so that the phase difference between the output clock B and the output clock A is also unstable. As shown in FIG. 4, the first rising edge after time point tp3 of the output clock B keeps an ideal phase difference of 202.5 degrees with the rising edge at time point tp3 of the output clock A due to an ideal duty cycle in period Tp1 of the output clock A. However in the case of the second rising edge of the output clock B, since the duty cycle between the rising edge and the falling edge in period Tp2 of the output clock A increases, the phase difference of the two rising edges of the output clocks A, B after time point tp4 increases to 207.5 degrees. Similarly, the phase difference between the rising edge and the falling edge of the output clocks A, B after time point tp5 decreases to 198.5 degrees. In other words, due to the instability of the duty cycle of the output clock, the phase difference of the rising edges of each output clock is accordingly unstable, so that a period cannot be divided equally as shown in FIG. 3.

Moreover, since the period of each output clock of the ring oscillator is in proportion to the sum of the delay time of the inverters, a plurality of inverters are required in order to generate a plurality of output clocks of the same frequency but different phases, and accordingly, the output clocks have a longer period. However, the period of the clock requires shortening in modern applications. In order to reduce the clock period, the ring oscillator requires a higher power to drive inverters to convert signal level rapidly to reduce the delay time Tg. However, this becomes a burden to the whole circuit.

In the prior art, in a ring oscillator many stages of inverters are required to generate output clocks of the same frequency with split phases. More inverters affect the feedback system of the ring oscillators and cause jitter, phase distortion, higher power consumption, and increased circuit complexity.

SUMMARY OF INVENTION

It is therefore a primary objective of the present invention to provide a phase-splitting method to generate multiple clocks of the same frequency but different phases, and to provide the related circuits using a ring oscillator comprising a digital phase interpolator to solve the problems mentioned above.

This invention takes advantage of a phase interpolator, which is a digital circuit that assists the ring oscillators. Reference clocks are generated by the ring oscillator with fewer stages of inverters and the phase interpolator interpolates the phases to generate the expected phase-splitting output clocks. If 16 phase-splitting output clocks are generated, in this invention 8 reference clocks are produced first by a ring oscillator comprising 4 stages of inverters. Then, 16 output clocks are interpolated by each reference clock to complete phase-splitting. Because fewer inverters in the ring oscillator are needed in the invention, noise and loading of the entire circuit will be reduced. Ring oscillators can generate better reference clocks, resulting in improved output clocks generated by the phase interpolator (less jitter, more precise clock periods). In addition, the phase interpolator in the invention is triggered to produce output clocks by different reference rising edges of each reference clock, so even if the period of each output clock has some distortion, phase is split precisely by the rising edges of each output clock.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
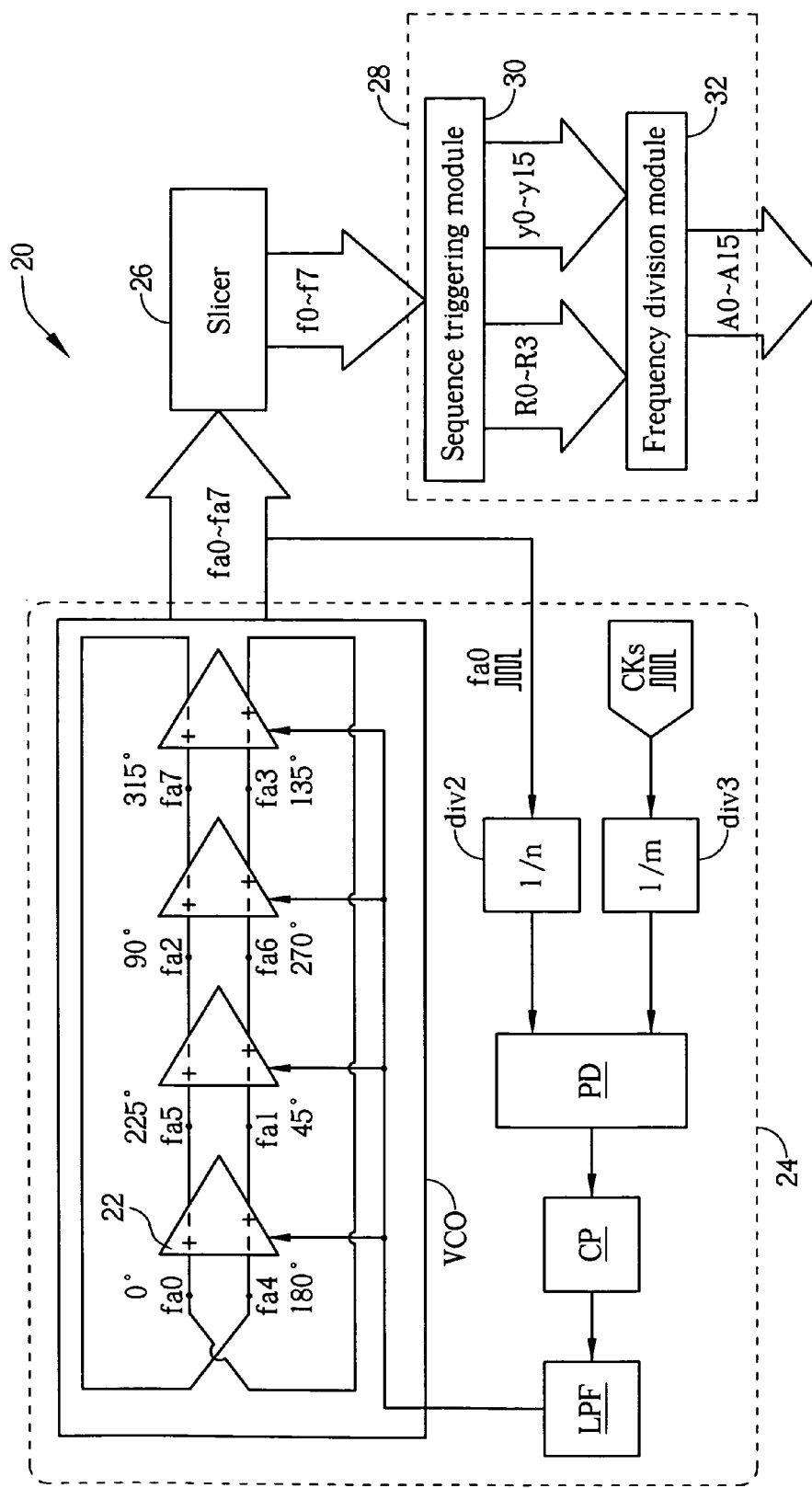
FIG. 5 illustrates functional blocks of a multiple-phase generating circuit according to the present invention.

Please refer to FIG. 5 showing a block diagram of a multiple-phase generating circuit 20 according to the present invention. The multiple-phase generating circuit 20 includes a clock generator 24, a slicer (waveform reshaper) 26, and a phase interpolator 28. When generating a plurality of output clocks of a specific frequency but different phases, the clock generator 24 generates reference clocks of the same frequency but different phases whose frequency is double the frequency of the output clocks. After waveform shaping by the slicer 26, the reference clocks will be input into the phase interpolator 28 to generate a plurality of output clocks of the same frequency but different phases.

Assuming that the multiple-phase generating circuit 20 generates 16 clocks A0–A15 of the same frequency but different phases, the clock generator 24 generates 8 reference clocks fa0–fa7 of the same frequency but different phases whose frequency is twice the frequency of the output clocks A0–A15. Since the reference clocks fa0–fa7 may deviate in waveform level (e.g. the amplitude does not reach a low level or a high level representing "0" and "1"), the slicer 26 shapes the reference clocks fa0–fa7 and adjusts their levels into shaped reference clocks f0–f7, and then outputs them to the phase interpolator 28. Since the reference clocks f0–f7 have a frequency twice the frequency of the output clocks A0–A15, the output clocks A0–A15 can be generated by utilizing different periods of the reference clocks f0–f7 to trigger frequency division. Therefore, the phase interpolator 28 has a sequence triggering module 30 for generating reset signals R0–R3 and intermediate clocks y0–y15 for sequence control according to different periods of the reference clocks f0–f7, so that a frequency division module 32 can divide frequencies of the intermediate clocks y0–y15 according to the reset signals R0–R3 to generate the output clocks A0–A15.

In order to generate the reference clocks fa0–fa7, a ring oscillator VCO having 4 differential phase inverters 22 can be installed in the clock generator 24, so that the reference clocks fa0–fa7 can be obtained at differential outputs of the differential phase inverters 22. In order to keep the frequency of the reference clocks fa0–fa7 stable, a phase lock loop is installed in the clock generator 24. The phase lock loop includes two frequency dividers div2, div3, a detector PD for detecting frequency/phase error, a charge pump CP, a low pass filter LPF, to work with a signal from the oscillator VCO fed back to the detector PD via the divider div2 (e.g. the reference clock fa0) to form a phase lock loop. The phase lock loop can lock the frequency of the reference clocks fa0–fa7 according to a standard clock CKs of a standard frequency. The standard clock CKs divided by a divider div3, and the reference clock fa0 divided by the divider div2 are both input to the detector PD to detect the error of the frequency and phase between the two signals, in order to control the charge pump CP and the low pass filter LPF to convert the error into corresponding voltage signals that are fed back the phase inverters 22 to adjust the frequency of the reference clocks fa0–fa7 (i.e. adjust the delay time of the phase inverters 22) accordingly. The reference clocks after frequency adjustment are sent back to the detector PD via the divider div2 and compared with the divided standard clock CKs. By repeating such process, the reference clocks fa0–fa7 can be synchronized to the standard clock CKs at a stable frequency. Assuming that the divider div2 is an 1/n divider, and the divider div3 is an 1/m divider, the operation of the phase lock loop makes fa=(n/m)*fs (fa is the frequency of the reference clocks fa0–fa7, fs is the frequency of the standard clock CKs). For instance, if fs is 800 MHz, in order to generate the reference clocks fa0–fa7 of 200 MHz, the divider div2 can be an ½ divider and the divider div3 can be an ⅛ divider to lock fa to be 200 MHz. After the operation of the oscillator VCO, the phase inverters 22 can generate the 8 reference clocks fa0–fa7. Taking the reference clock fa0 as a phase of 0 degrees, the phase difference and the nodes of the reference clocks fa0–fa7 are shown in FIG. 5. As described above, the reference clocks fa0–fa7 are adjusted by the slicer 26 to form the reference clocks f0–f7, while the reference clocks f0–f7 are also in the same frequency but different phase.

Figure 6A:
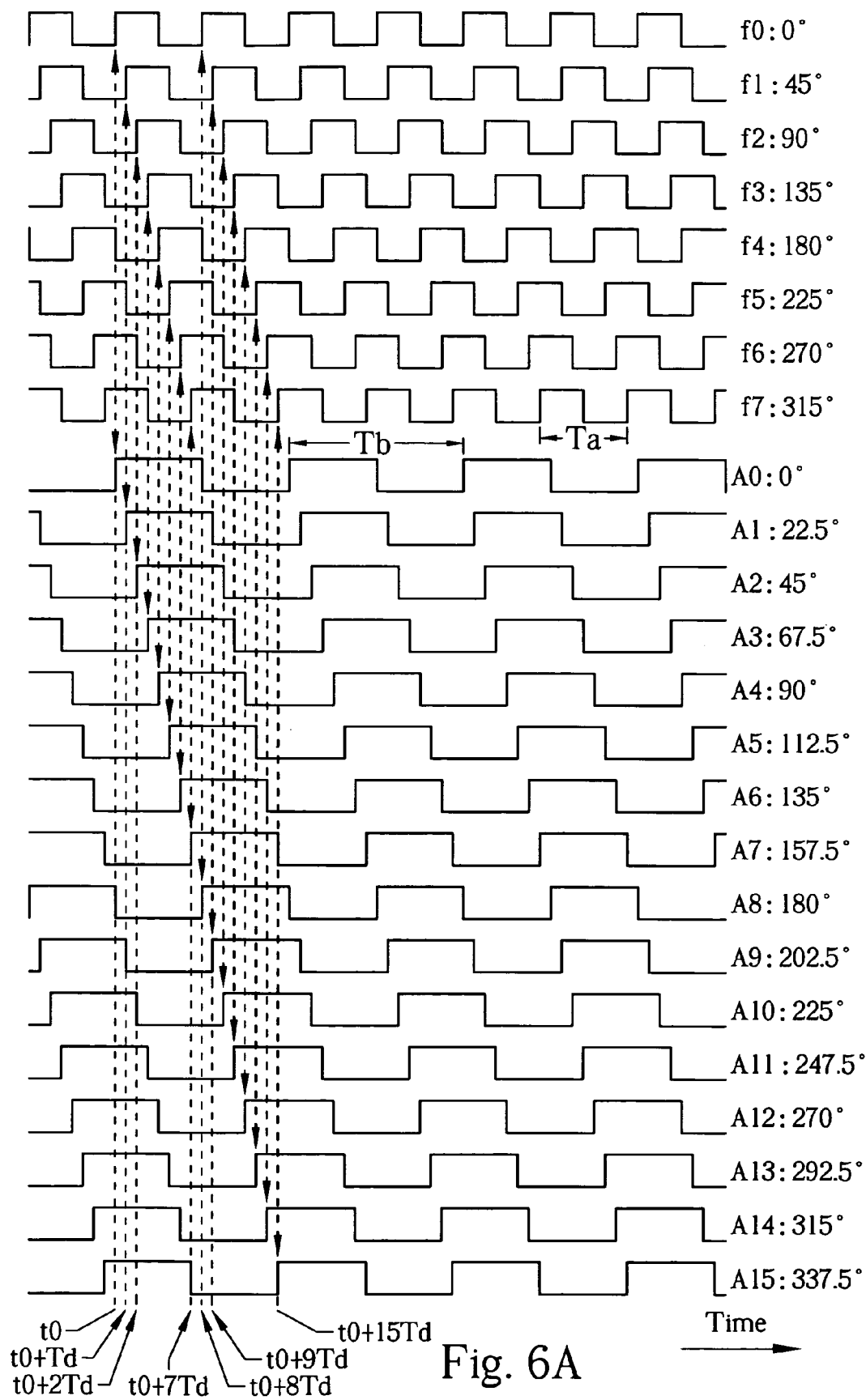
FIG. 6A and FIG. 6B illustrate an origin of phase interpolation according to the present invention.

Please refer to FIG. 6A showing a waveform timing diagram of the reference clocks f0–f7 and the output clocks A0–A15, wherein the horizontal axis represents time and the vertical axis represents amplitude. As described above, the output clocks A0–A15 are generated by dividing the reference clocks f0–f7. For instance, in order to generate the 16 output clocks A0–A15 of a frequency of 100 MHz, the clock generator 24 generates the 8 reference clocks fa0–fa7 for frequency division. As shown in FIG. 6A, the period of the reference clocks fa0–fa7 is Ta (i.e. a reference period), the period of the output clocks A0–A15 is Tb, Th being twice Ta. The present invention utilizes different reference periods of the reference clocks to trigger different periods of the output clocks. For instance, as shown in FIG. 6A, by triggering ½ frequency division by the rising edge of the reference clock f0 at time point t0, the output clock A0 has a rising edge substantially fitting the rising edge of the reference clock f0 at time point t0. Similarly, by triggering frequency division by the rising edge of the reference clock f1 at time point t0+Td (Td is the delay time of the phase inverter 22), the output clock A1 has a rising edge substantially fitting the rising edge of the reference clock f1 at time point t0+Td. In the same way, 8 rising edges of the reference clocks f0–f7 at time points t0–t0+7Td respectively trigger the output clocks A0–A7. Since the reference clocks are twice the frequency of the output clocks, the reference clocks f0–f7 have twice the phase difference of the output clocks A0–A7. For instance, there is the delay time Td between the rising edges of the reference clocks f0, f1, and according to the above description, the delay time Td should be ⅛ the reference period Ta and equivalent to a phase difference of 45 degrees of the reference clock (i.e. 360*Td/Ta). After triggering, the time difference between the rising edges of the output clocks A0, A1 is also the delay time Td, but the period Tb of the output clock is twice the reference period Ta, thus the phase difference between the output clocks A0, A1 becomes 22.5 degrees (i.e. 360*Td/Tb) being half the phase difference of 45 degrees of the reference clocks f0, f1. Similarly, the phase difference of 90 degrees of the reference clocks f0, f2 causes the phase difference of 45 degrees of the output clocks A0, A2, the reference clocks f0–f7 having a phase difference of 0–315 degrees can trigger the output clocks A0–A7 to have a phase difference of 0–157.5 degrees. In other words, the reference clocks f0–f7 can be divided by the reference period Ta equally among 8 rising edges between time points t0–t0−7Td, which corresponds to the output clocks A0–A7 being divided by half a period Tb (equivalent to a phase of 180 degrees) equally among 8 rising edges between time points t0–t0+7Td.

Continuously, at time point t0+8Td, the rising edge of the second period of the reference clock f0 triggers frequency division to generate an output clock A8. Since the reference period Ta is equivalent to a phase difference of 180 degrees in the output clock, two continuous periods of the reference clock triggers frequency division of two output clocks having a phase difference of 180 degrees. For instance, the rising edges of the reference clock f1 at time points t0+Td, t0+9Td triggers frequency division of output clocks A1, A9 corresponding to phase differences of 22.5 and 202.5 degrees having a phase difference of 180 degrees between each other. Similarly, the rising edges of the reference clock f7 at time points t0+7Td, t0+15Td triggers frequency division of output clocks A7, A15. In other words, the rising edges of the first reference periods of the reference clocks f0–f7 respectively triggers frequency division of the output clocks A0–A7 between time points t0–t0+7Td, and the rising edges of the second reference periods of the reference clocks triggers respectively frequency division of the output clocks A8–A15 between time points t0+8Td–t0+15Td. The phase of 180 degrees of the output clocks (equivalent to a reference period Ta) can be divided equally by 8 by the 8 reference clocks, and the phase of 360 degrees of the output clocks can be divided equally by 16. The frequency division module 32 is used to divide the clocks into the output clocks.

Figure 6B:
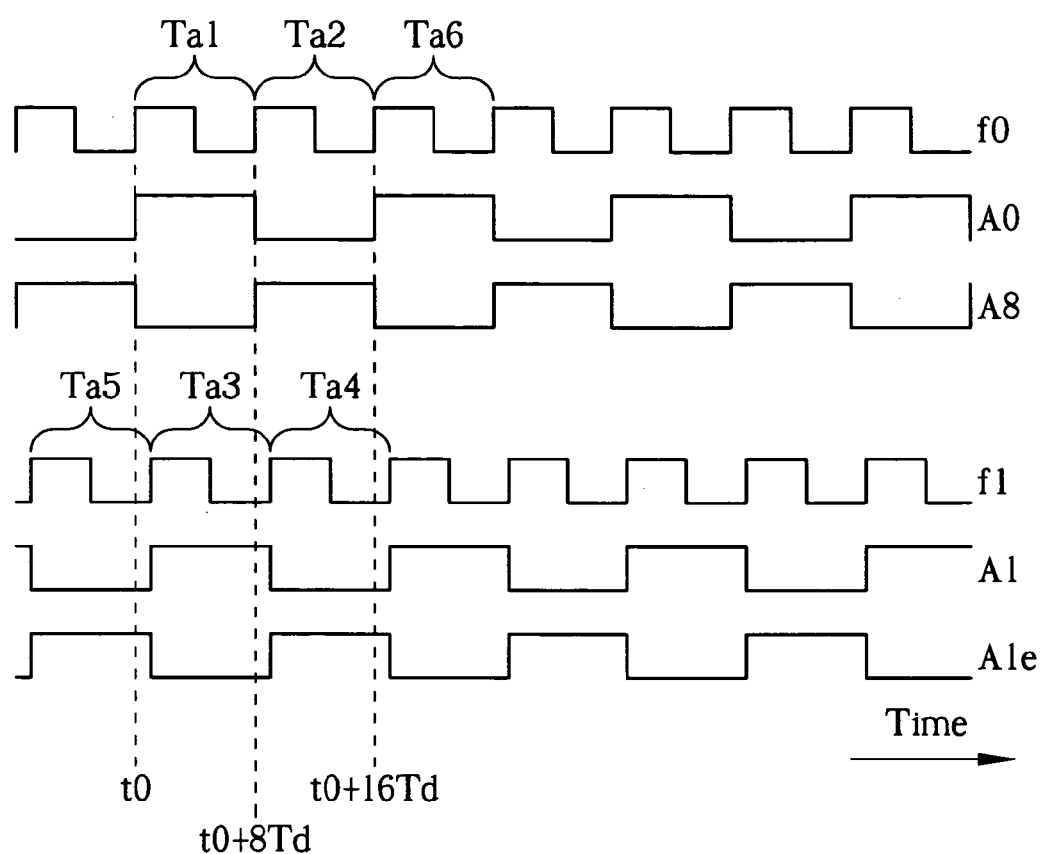

In the present invention, the time to trigger frequency division must be aligned carefully. Please refer to FIG. 6B showing a waveform timing diagram of the multiple-phase generating circuit 20 of FIG. 5, wherein the horizontal axis represents time, and the vertical axis represents waveform amplitude. As shown in FIG. 6B, when utilizing the rising edge of the reference clock f0 at time point t0 (i.e. the rising edge of the first reference period of the reference clock f0) to trigger frequency division of the output clock A0, the second reference period Ta2 must be used to trigger the output clock A8. If an incorrect reference period is used, the phase splitting cannot be completed. Similarly, the first rising edge of the reference clock f1 after time point t0 must be used to trigger frequency division, and if the reference period Ta5 or Ta4 is used, the output clock will be A1e (FIG. 6) having a phase difference of 180 degrees with the output clock A1. In other words, it is recommended to use a reference period of the reference clock f0 (such as the reference period Ta1) and then select other periods whose phases lag the reference period Ta1 to trigger the output clocks. For instance, in order to trigger the output clock A8 having a phase difference of 180 degrees, the reference period Ta2 lagging the reference clock by 360 degrees should be used to trigger frequency division, instead of the reference period Ta1 or Ta6. In this way, based on the rising edge of the reference clock f0 at time point t0, in order to generate the output clock A15 correctly, triggering frequency division by the rising edge of the reference clock f7 at time point t0+15Td is preferred. In order to achieve this purpose, the phase interpolator 28 includes the sequence triggering module 30 to control the frequency division module 32 by the intermediate clocks y0–y15 and the reset signals R0–R3.

Figure 7:
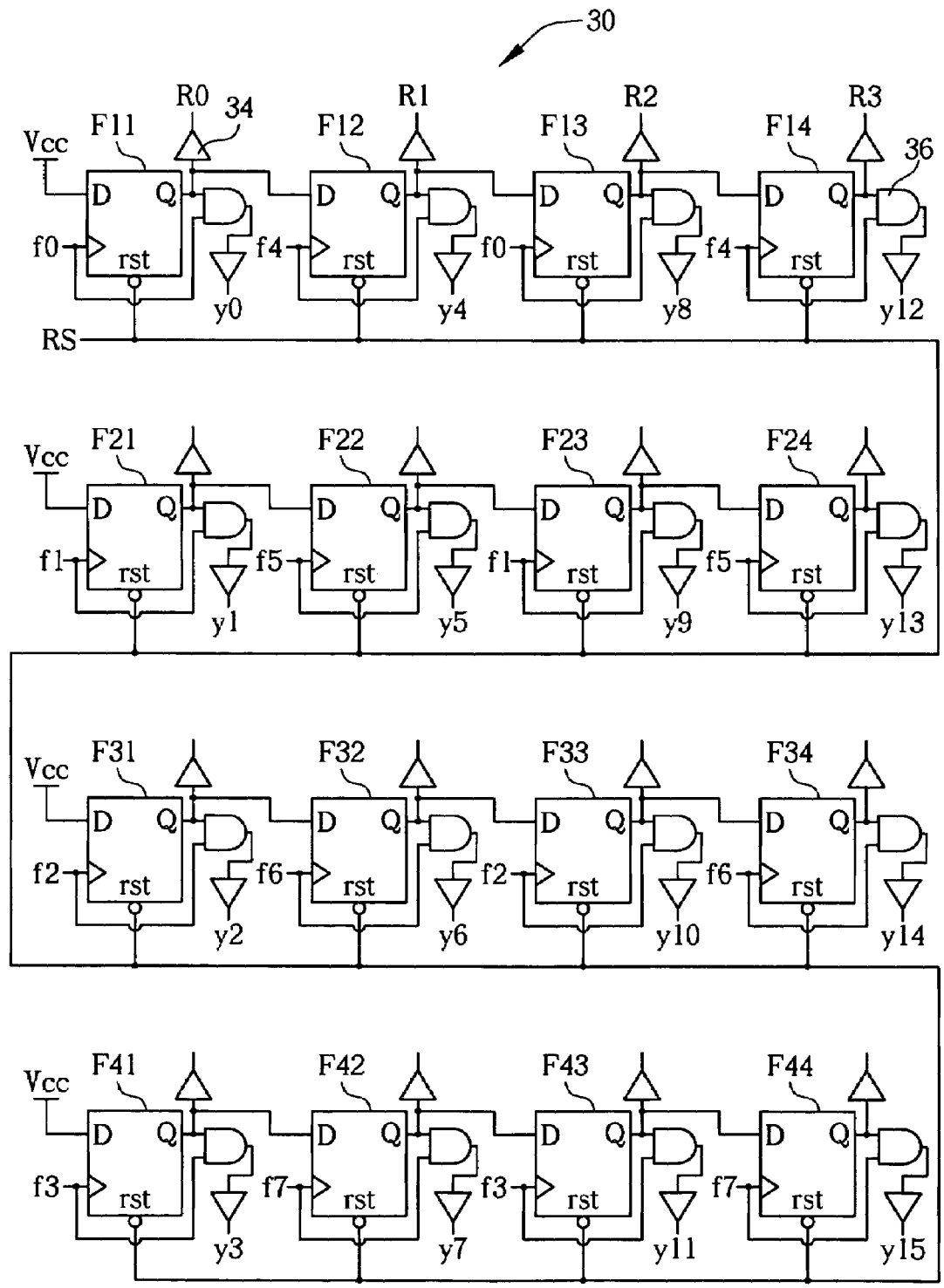
FIG. 7 illustrates the sequence triggering module of FIG. 5.

Please refer to FIG. 7 showing a circuit diagram of the sequence triggering module 30 according to the present invention. The sequence triggering module 30 includes 16 flip-flops (which can be D flip-flops) F11–F14, F21–F24, F31–F34, F41–F44 triggered by a falling edge, several auxiliary AND gates 36 for AND operation, and a buffer 34 for increasing driving ability of signals and preventing noise from entering the sequence triggering module 30. Each flip-flop has an input end D, an output end Q, a reset end rst and, a clock end (depicted as a triangle in FIG. 7), to be triggered by a clock and output corresponding signals from the output end Q. The reset end rst is triggered by an initial signal RS. The flip-flops F11–F14 can be regarded as a set, the flip-flop F11 is triggered by the reference clock f0. The input end D is electrically connected to a direct current voltage Vcc, which is equivalent to continuously inputting a high level digital "1" into the input end D. Regarding the output end Q, a reset signal R0 is output via the buffer 34, and the same signal is input to the next flip-flop F12 as an input to the input end D of the flip-flop F12. The output at the output end Q of the flip-flop F11 is ANDed with the clock f0 at the AND gate in order to generate an intermediate clock y0. The flip-flop F12 is triggered by the reference clock f4 to receive the output from the previous flip-flop F11 at its input end D, and outputs signals at the output end Q to the next flip-flop 13. The output of the flip-flop F12 is converted into a reset signal R1 via the buffer and ANDed with the reference clock f4 to generate an intermediate clock y4. The flip-flop F13 receives the output of the flip-flop F12, and then generates an output to the flip-flop F14 according to the trigger of the reference clock f0, to form a reset signal R2 and an intermediate clock y8. Finally, the flip-flop F14 receives the output of the flip-flop F13, and then generates an output to the flip-flop F14 according to the trigger of the reference clock f4, to form a reset signal R3 and an intermediate clock y12. In other words, among the flip-flops F11–F14, the output of a flip-flop is the input of the next flip-flop, and alternately triggered by the reference clocks f0, f4, f0, f4, the intermediate clocks y0, y4, y8, y12 are generated.

Similarly, among the flip-flops F21–F24, the input end D of the flip-flop F21 receives a digital "1", and the next flip-flops F22–F24 receive the output of the respective previous flip-flop as an input, and by being alternately triggered by the reference clocks f1, f5, f1, f5, the intermediate clocks y1, y5, y9, y13 are generated. Among these flip-flops, it is not necessary to generate reset signals (R0–R3) at the outputs Q, but the outputs Q are still connected to a buffer for a dummy load. Similarly, among the flip-flops F31–F34, the flip-flop F31 receives a digital "1", and the next flip-flops F32–F34 receive the output of the respective previous flip-flop as an input, and by being alternately triggered by the reference clocks f2, f6, f2, f6, the intermediate clocks y2, y6, y10, y14 are generated. The flip-flops F41–F44 are triggered by the reference clocks f3, f7, f3, f7 such that the intermediate clocks y3, y7, y11, y15 are generated.

Figure 8:
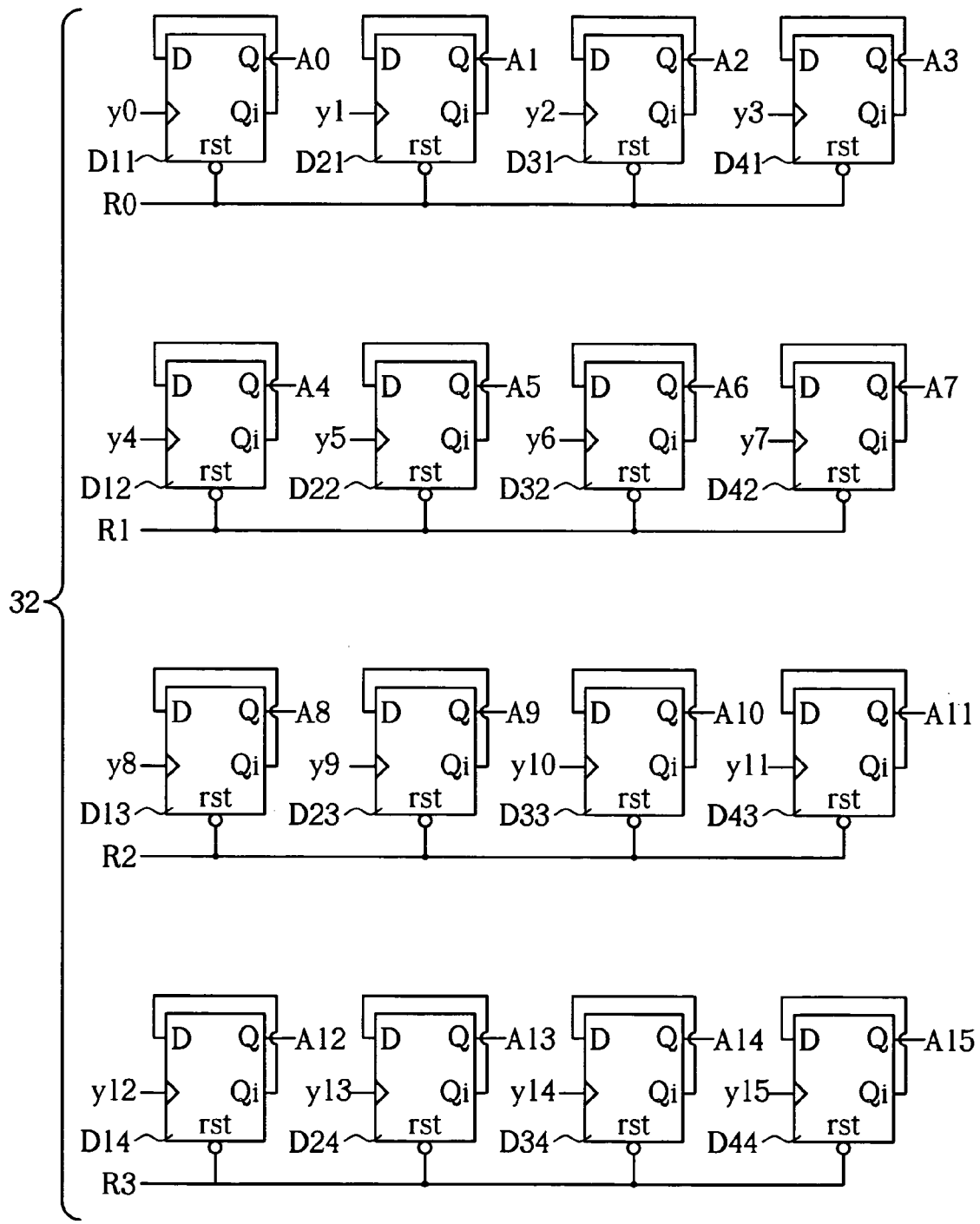
FIG. 8 illustrates the frequency division module of FIG. 5.

Please refer to FIG. 8 showing a block diagram of the frequency division module 32 according to the present invention. According to the intermediate clocks y0–y15 and the reset signals R0–R3 generated by the sequence triggering module 30, the frequency division module 32 can divide frequencies correctly to generate the output clocks A0–A15. The frequency division module 32 includes 16 flip-flops (which can be D flip-flops) D11–D41, D12–D42, D13–D43, D14–D44 triggered by a rising edge. Each flip-flop has a clock end (depicted as a triangle in FIG. 8), a reset end rst, an input end D, an output end Q, and an inverse output end Qi. Each inverse output end Qi is electrically connected to the input end D in order to connect each flip-flop as a ½ frequency divider. The flip-flops D11–D41 are controlled by the reset signal R0 to divide the intermediate clocks y0–y3 in order to generate the output clocks A0–A3. Similarly, the flip-flops D12–D42 are controlled by the reset signal R1 to divide the intermediate clocks y4–y7 in order to generate the output clocks A4–A7. The flip-flops D13–D43 are controlled by the reset signal R2 to divide the intermediate clocks y8–y11 in order to generate the output clocks A8–A11. The flip-flops D14–D44 are controlled by the reset signal R3 to divide the intermediate clocks y12–y15 in order to generate the output clocks A12–A15.

Figure 9A:
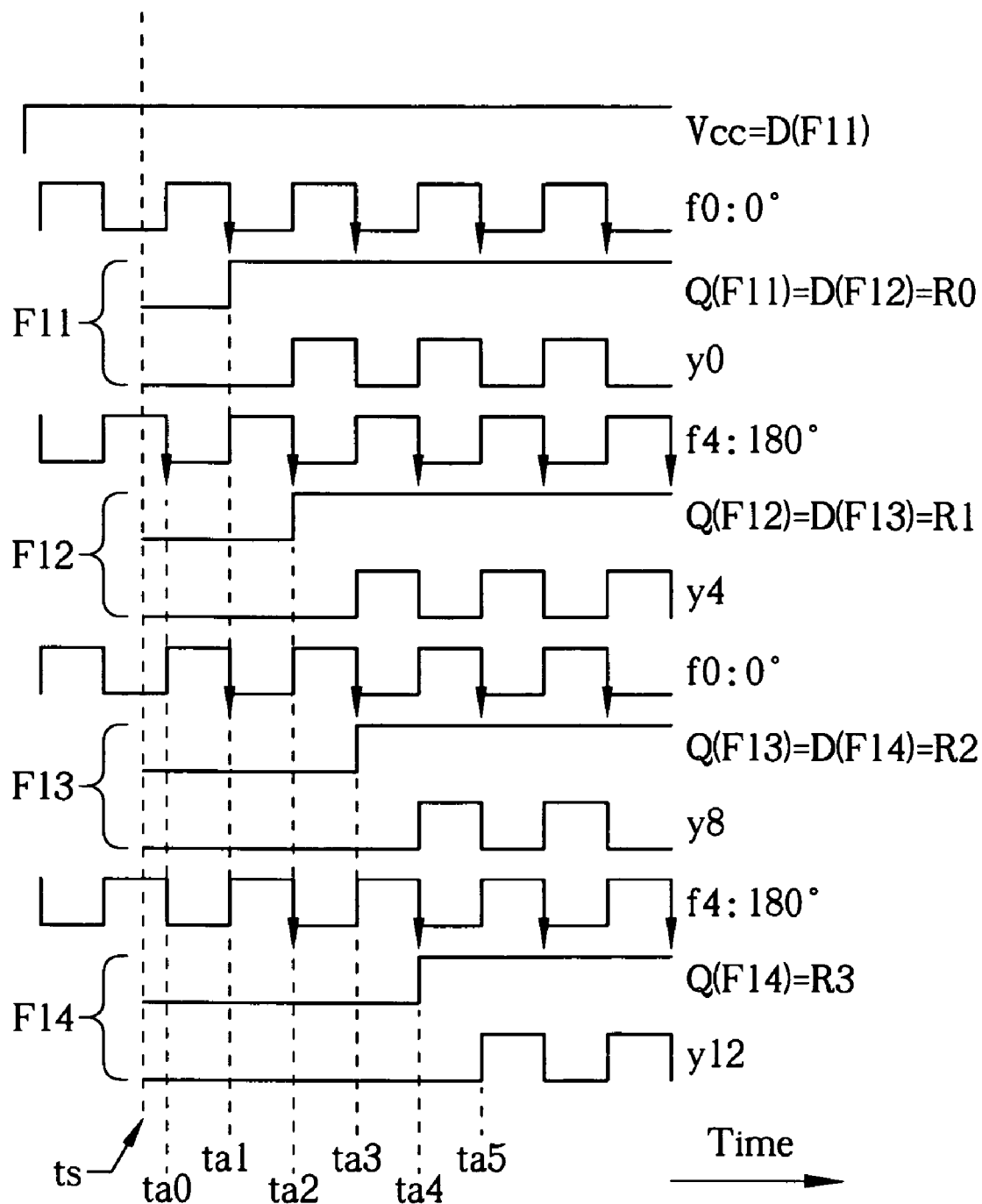
FIG. 9A to FIG. 9D illustrate waveforms and timing sequences of signals of the sequence triggering module of FIG. 7.

Please refer to FIG. 9A to FIG. 9D showing waveform timing diagrams of the sequence triggering module 30, wherein the horizontal axis represents time, and the vertical axis represents waveform amplitude, and symbols such as D(F11), Q(F44) represent signals at the input end D of the flip-flop F11 and the output end Q of the flip-flop F44, and so on. FIG. 9A shows the waveform timing related to the flip-flops F11–F14. Assuming that the initial signal RS starts triggering the flip-flops F11–F14, F21–F24, F31–F34, F41–F44 to reset at time point ts, D(F11) is reset to be a low level digital "0" (which can be implemented by a low level reset signal RS). Although D(F11) is always a digital "1", since the flip-flop F11 is triggered by a falling edge, the flip-flop F11 triggered by the clock f0 will sample a digital "1" at D(F11) on the falling edge at time point ta1, and accordingly the signal corresponding to Q(F11) goes up to high level digital "1". Of course, the signal at Q(F11) becomes the signal at D(F12) and the reset signal R0. Furthermore, the intermediate clock y0 is generated after the signal at Q(F11) is ANDed with the reference clock f0. As shown in FIG. 9A, since the signal at Q(F11) becomes a digital "1" at time point ta1, meaning that the reference period of the reference clock f0 is erased before time point ta1 in the AND operation, the rising edge of the first period of the intermediate clock y0 occurs at time point ta2.

After resetting the flip-flop F12 at time point ts (although at time point ta0 there is a falling edge) and since the signal at D(F12) is a digital "0", Q(F12) is also a digital "0" until D(F12) becomes a digital "1" at time point ta1, the falling edge of the clock f4 at time point ta2 makes the output of Q(F12) become a digital "1", and the signal at Q(F12) become the reset signal R1. Since the signal at Q(F12)

becomes a digital "1" at time point ta2, the reference periods of the reference clock f4 before the time point will disappear in the AND operation, so that the intermediate clock y4 shows the rising edge of the first period at time point ta3. Similarly, the signal at D(F13) becomes "1" at time point ta2, accordingly the signal at Q(F13) becomes "1" at time point ta3 (and forms the reset signal R2), and the intermediate clock y8 shows the rising edge of the first period at time point ta4. The signal at D(F13) becomes "1" at time point ta4, accordingly the signal at Q(F13) becomes "1" at time point ta4 (and forms the reset signal R3), and the intermediate clock y12 shows the rising edge of the first period at time point ta5.

Since flip-flops F12–F14 receive input from the outputs Q of the previous flip-flop and the reference clocks f0, f4, f0, f4 have a phase difference of ½ period, the signals output by the flip-flops F11–F14 at the outputs Q(F11)–Q(F14) will be digital "1" at intervals of /1;2 period in sequence from time point ta1 to time point ta4, and these four signals can be sequence control signals R0–R3. Similarly, the rising edge of the first period of the intermediate clocks y0, y4, y8, y12 will appear respectively in sequence at time points ta2, ta3, ta4, ta5. In addition, since FIG. 9A (and other timing diagrams) is a timing diagram, a gate delay of the input and output of each flip-flop and logic gate should be considered. For instance in FIG. 9A, the rising edge of Q(F11) is delayed to the falling edge of the reference clock f0 at time point ta1. In order to ensure that the intermediate clock y0 follows each period of the reference clock f0 from time point ta2, the gate delay of the flip-flop and the AND gate 36 should be less than ½ period of the reference clock to make sure the signal at the output end of the flip-flop Q changes level between time points ta1 and ta2, so that the intermediate clock y0 can follow the period of the reference clock f0 starting from time point ta2. Such kind of gate delay is well known in the prior art, thus a further description is hereby omitted.

Figure 9B:
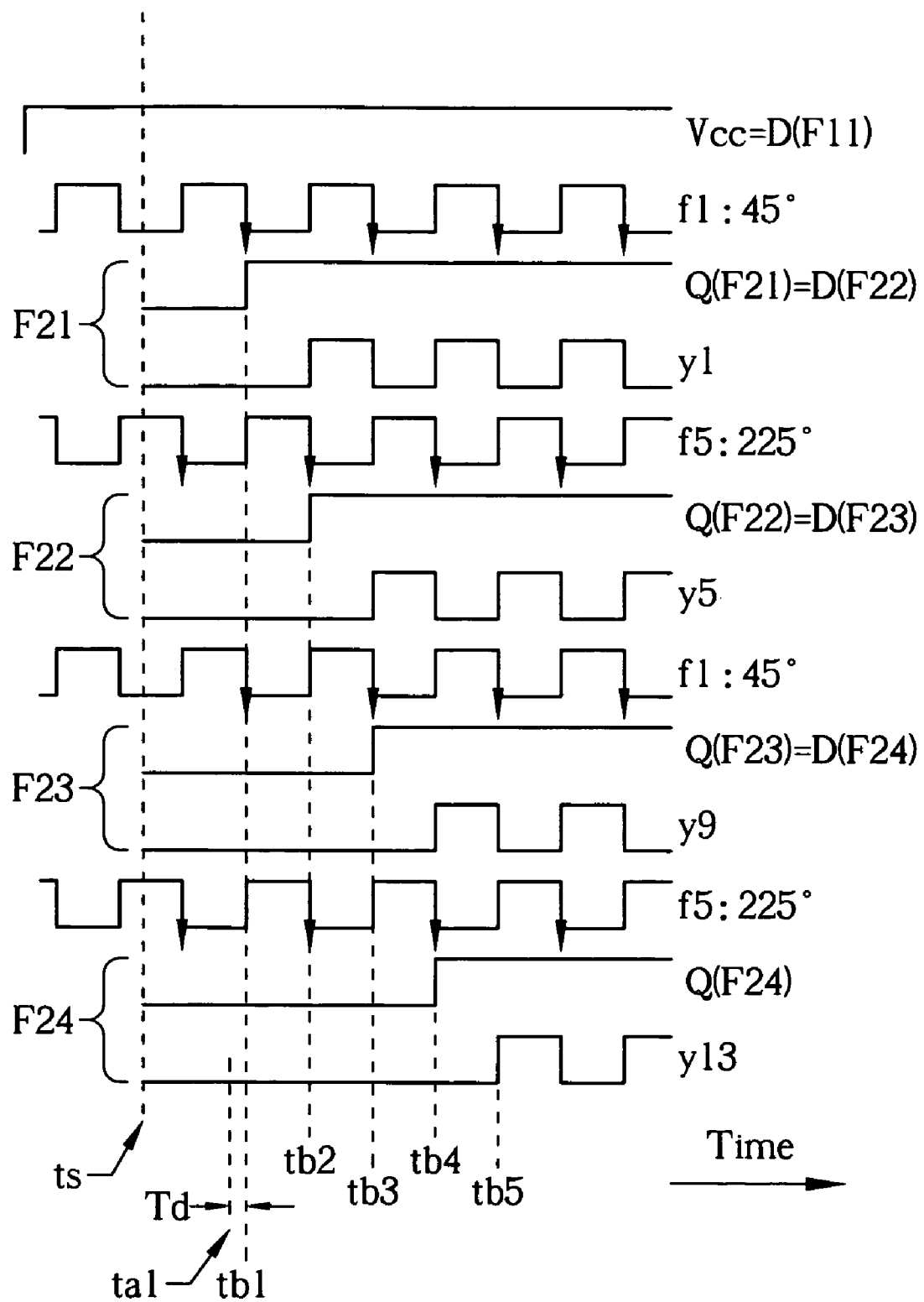

Similarly, the flip-flop F21 receives a digital "1" at D(F21), and the flip-flops F22–F42 take the output of the previous flip-flop as their input; thus, signals at Q(F21)–Q(F24) will become digital "1" respectively at time points tb1–tb4 in sequence after being reset by the initial signal RS at time point ts, as shown in FIG. 9B. Rising edges of the first periods of the output signals of each flip-flop, reference clocks f1, f5 and the intermediate clocks yl, y5, y9 and y13 operated from f1 and f5 will also appear at time points tb2, tb3, tb4, tb5 in sequence. The marked time points ts in FIG. 9A–FIG. 9D stand for the restarting time when signals RS trigger the reset of each flip-flop. FIG. 9B also shows the time point "ta1" as in FIG. 9A (that is, the time point of rising edge of Q(F11) output). Because phase of the reference clock f1 lags that of the reference clock f0 by 45 degrees, the phase difference between them is equal to a delay time Td. In the example of FIG. 9B, the time point tb1, which is a rising edge of Q(F21) output, will lag the time point ta1 by a delay time Td. Outputs D(F21) to D(F24) of the flip-flops F21 to F24 are not taken as reset signals because these flip-flops primarily generate intermediate clocks y1, y5, y9 and y13.

Figure 9C:
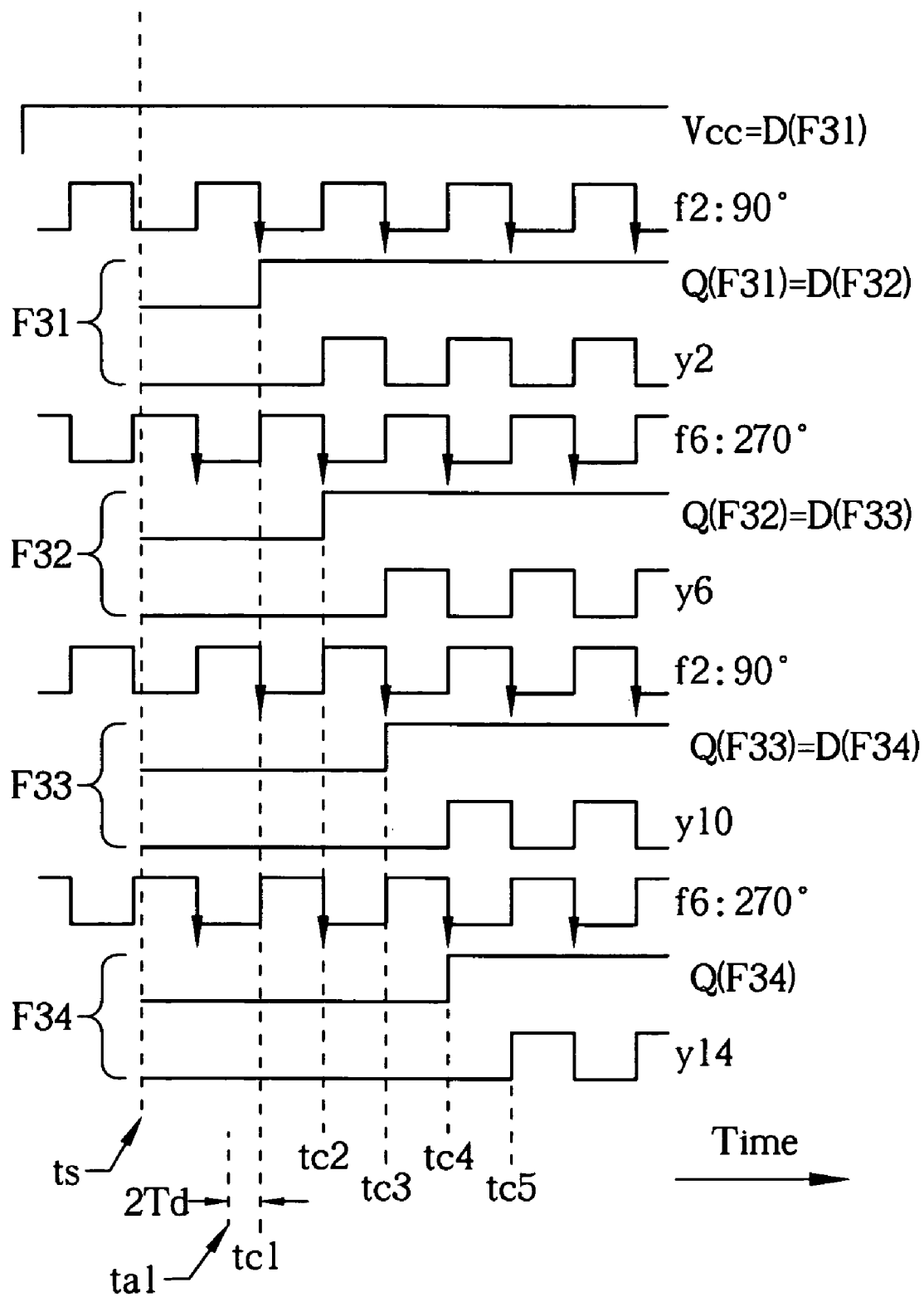

FIG. 9C shows the output signals of Q(F31) and Q(F34) of the flip-flops F31 and F34, and the intermediate clocks y2, y6, y10 and y14 generated by the flip-flops F31 and F34. According to the operation principles previously described, if the flip-flops are reset at time point ts, outputs of Q(F31) and Q(F34) will transfer from a digital "0" to digital "1" at time points tc1 to tc4 in sequence after they are triggered by reference clocks f2, f6, f2 and f6 and, thus, the rising edges of the first periods of the intermediate clocks y2, y6, y10, and y14 will appear at time points tc2, tc3, tc4 and tc5. Similarly, FIG. 9C also shows time point ta1 previously shown in FIG. 9A. Because the phase of the reference clock f2 lags that of the reference clock f0 by 90 degrees, and the phase difference between them is equal to two delay times, the time point tc1 in FIG. 9A, which is a rising edge of Q(F31) output, will lag the time point ta1 by two delay times Td.

Figure 9D:
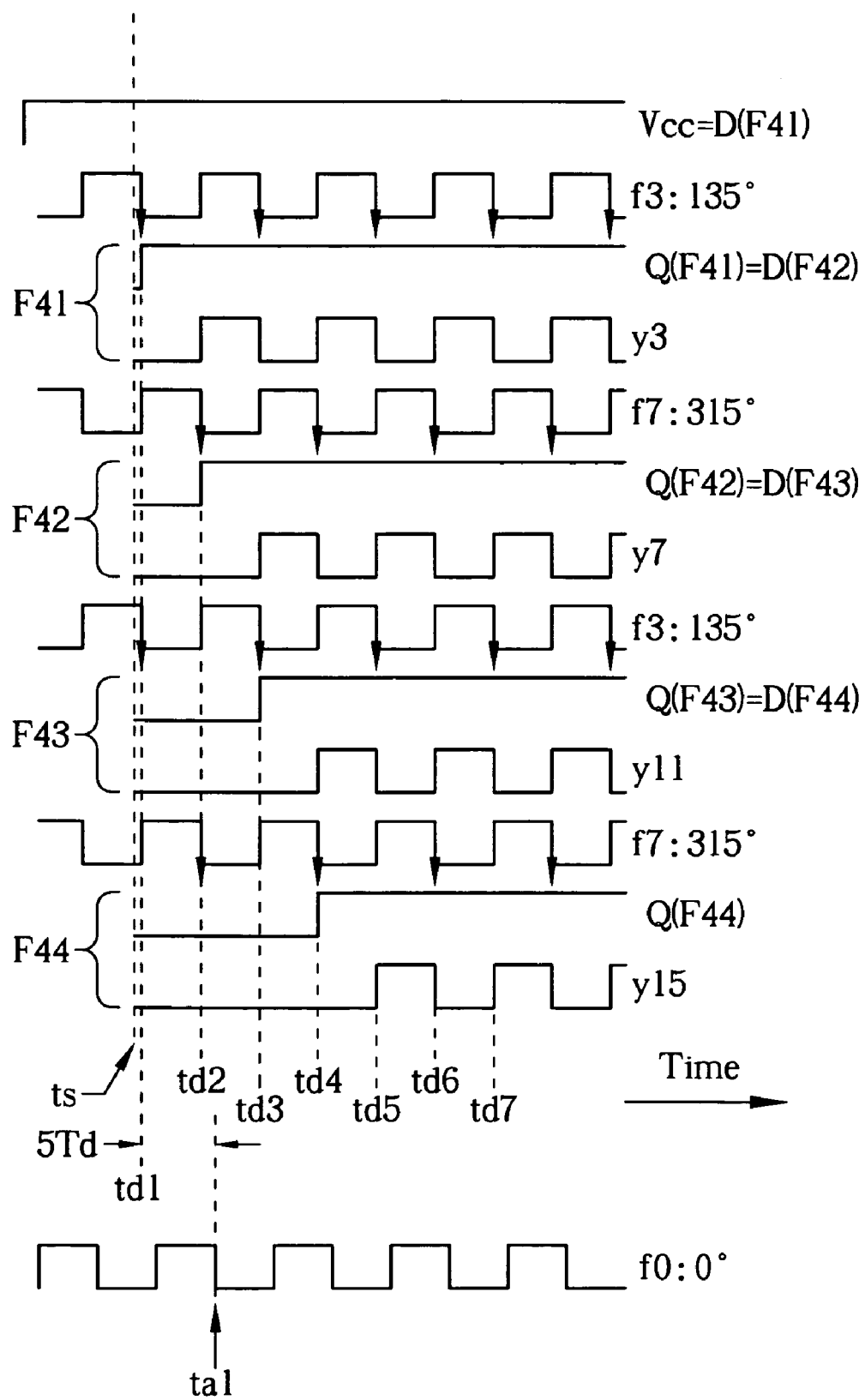

FIG. 9D shows the waveforms and time sequences of the relative signals in flip-flops F41 to F44. Similarly, if the flip-flops are reset at time point ts, outputs Q(F41) to Q(F44) of the flip-flops F41 and F44 will transfer from a digital "0" to a digital "1" at time points td1 to td4 in sequence after they are triggered by reference clocks f3, f7, f3 and f7, which have 180 degrees phase difference between them. Thus, the AND operation of these sequence signals and reference clocks f3, f7, f3 and f7 will generate intermediate clocks y3, y7, y11, and y15, whose rising edges of the first periods will appear at time points td2 to td5. However, the time ts when the starting signal RS resets each flip-flop is not necessarily synchronous to each reference clock. As shown in FIG. 9A to FIG. 9D, time point ts does not occur at the same time as any rising edge or falling edge of the reference clock. Therefore, the first falling edge of each reference clock triggering each flip-flop after time point ts will appear before time point ta1. For comparison, FIG. 9D plots the waveform and time sequence of the reference clock f0. As in the example taken in FIG. 9D, although the phase of the reference clock f3 lags that of the reference clock f1 by 135 degrees, the reset time ts is closer to the falling edge of the reference clock f3 and falls in the former period of the reference clock f3 resulting in the rising edge of the output signal Q(F41) of the flip-flop F41 occurs as early as at the time point td1 and even get ahead of the time point ta1.

To summarize the operation of the flip-flops F11 to F14, F21 to F24, F31 to F34 and F41 to F44 in the sequence triggering module 30, each flip-flop taking the outputs of the previous stage, also flip-flops, as inputs outputs a signal Q that transitions from a digital "0" to a digital "1" through triggering of the different reference clocks when the output of the previous flip-flop also transfers from a digital "0" to a digital "1"; then, the output signal Q of each flip-flop will be reset to "0" through the AND operation before the rising edge of the corresponding output signal Q of the corresponding reference clock, thereby generating the corresponding intermediate clock. Therefore, the rising edge of the first period of each corresponding intermediate clock will appear in sequence according to the sequence of each flip-flop. As shown in FIG. 9A for example, of the flip-flops F11 to F14, the rising edge of the output Q(F12) where the second flip-flop F12 transfers from a digital "0" to a digital "1" must occur after time point ta1; the actual time of rising edge depends on the phase difference of two reference clocks, f0 and f4, triggered by flip-flops F11 and F12. Because the reference clock f4 lags the reference clock f0 by 180 degrees, the rising edge of Q(F12) lags by half a period and appears at ta2. By the AND operation intermediate clocks y0 and y4 will be generated according to output Q(F11) and Q(F12). Due to the sequence of output signals Q(F11) and Q(F12), it is certain that the first period of the intermediate clock y4 between time points ta3 and ta5 will lag the first period of the intermediate clock y0 between time points ta2 and ta4, so the phase of the reference clock f4 must lag that of the reference clock f0.

As previously discussed regarding FIG. 6B, frequency division can be based on one reference period of the reference clock f0, and the other reference clocks, of which the lagged phase is desired, will sequentially generate the other frequency-divided output clocks. The intermediate clocks generated by each flip-flop in the sequence triggering module 30 are based on the first period of each corresponding first-stage flip-flop, and the first period of the other stages of the corresponding flip-flops will have their desired lagging phase. Similar to the description above, of the intermediate clocks y0, y4, y8 and y12 generated by flip-flops F11 to F14, the times between the rising edge of the first period of y0 and that of y4, y8 and y12 differ by 0.5 period, 1 period and 1.5 periods, respectively, that is, 180, 360, and 540 degrees of phase difference. If the output clocks A0, A4, A8 and A12 of frequency division are triggered by the first periods of the intermediate clocks y0, y4, y8, and y12, these output clocks (relative to A0) will have 0, 90, 180, 270 degrees of phase difference, which satisfies the relationship to be expected in FIG. 6A. Similarly, the intermediate clocks y1, y5, y9, y13 generated by flip-flops F21 to F24 are also based on the first period of y1, and the first period of y5, y9, y13 will lag y1 by 180, 360, 540 degrees of phase difference, respectively. Relationships between the intermediate clocks generated by the other sets of flip-flops are similar. However, just as described before, because the time to reset each flip-flop ts is not synchronous with each reference clock, the phase difference of the first periods of the intermediate clocks generated by different sets of flip-flops does not necessarily satisfy the desired relationship. In this situation, correction needs to be performed in frequency division module 32 according to the reset signals R0 to R3.

Figure 10A:
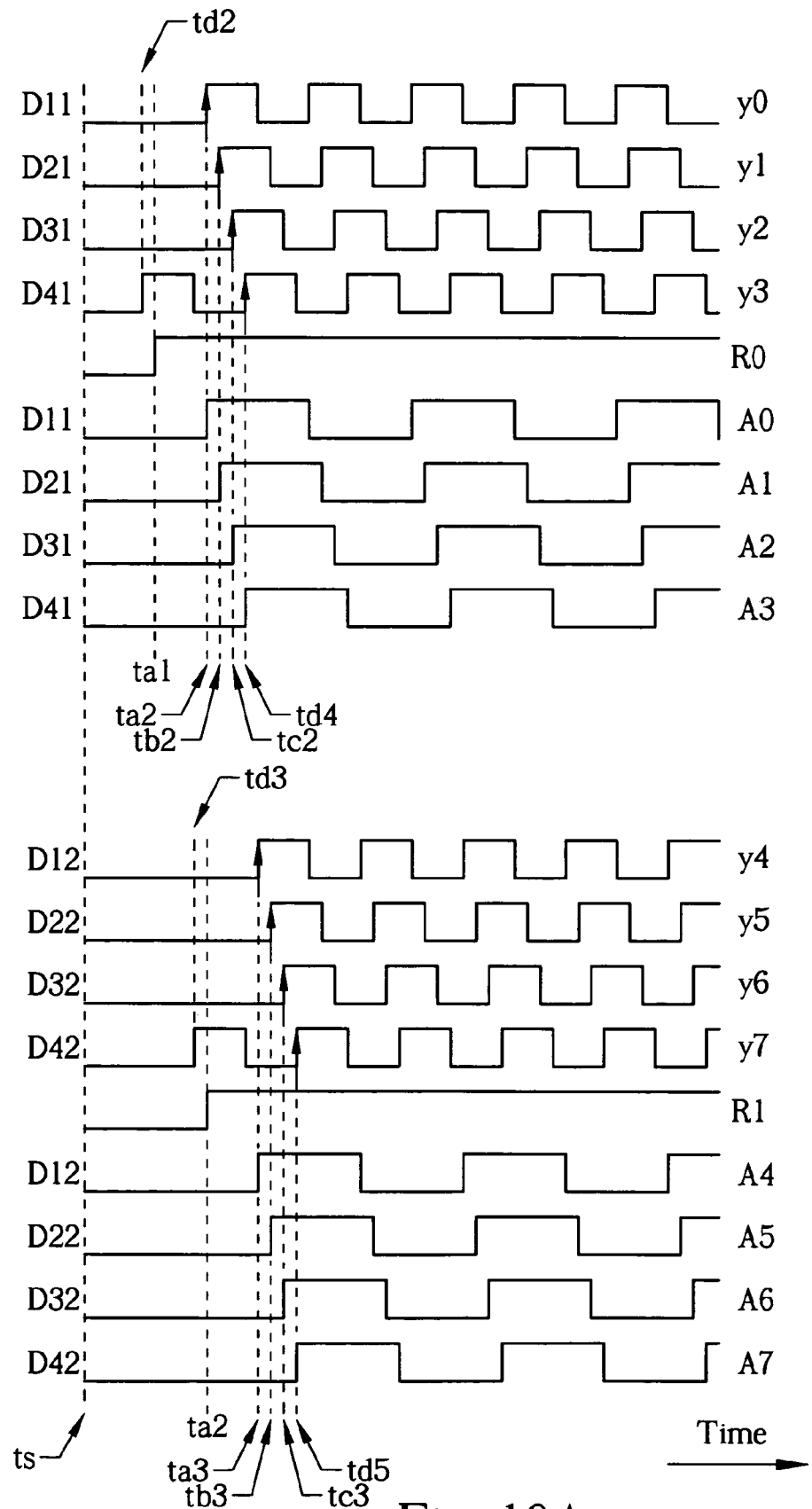
FIG. 10A to FIG. 10B illustrate waveforms and timing sequences of signals of frequency division module of FIG. 8.
Figure 10B:
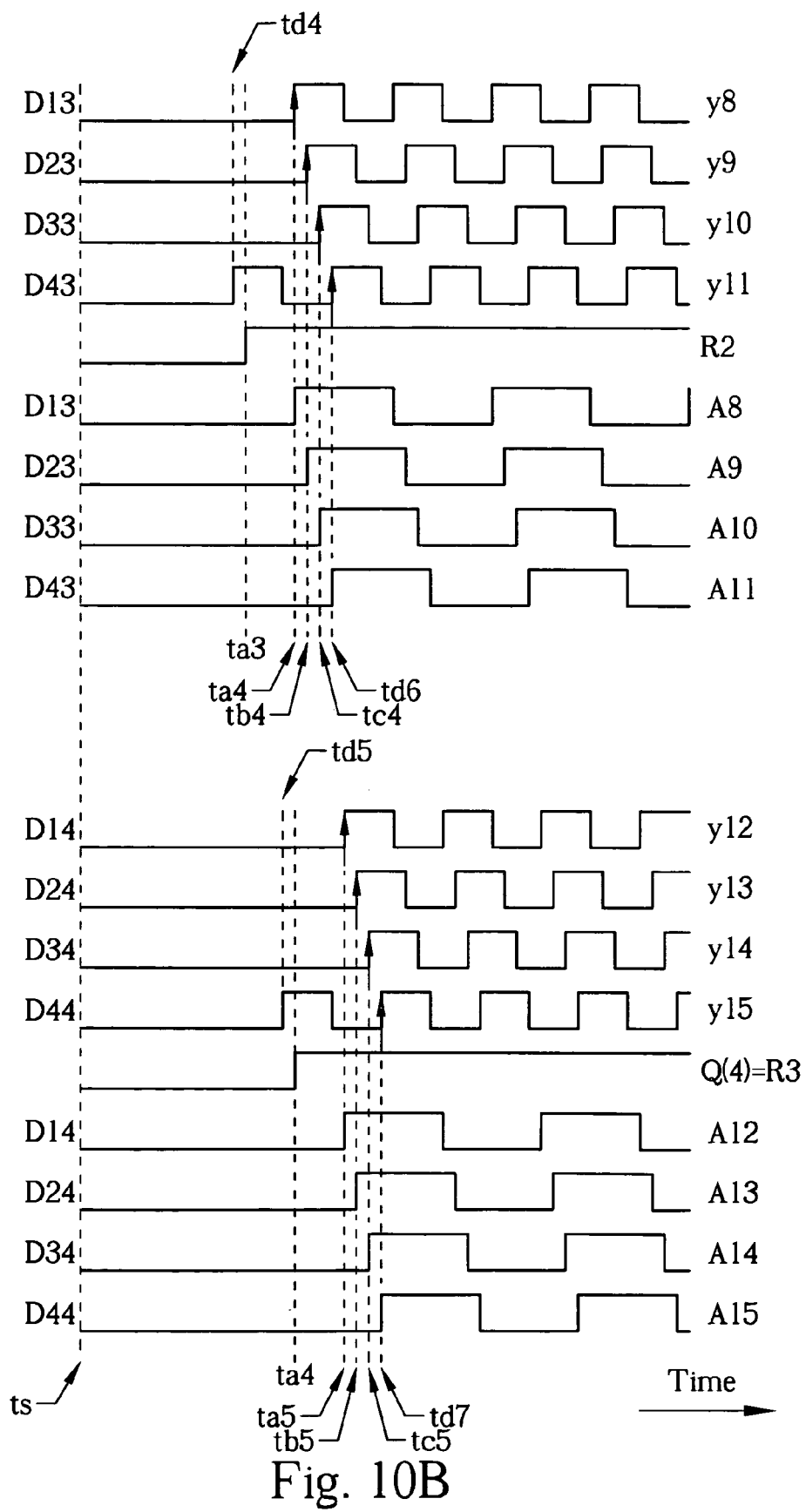

Please refer to FIG. 10A and FIG. 10B (and also FIG. 8, FIG. 9A to FIG. 9D). FIG. 10A and FIG. 10B show the waveforms and time sequences of signals when the frequency division module 32 is operating. The X-axis of the plot stands for time and the Y-axis represents the waveform amplitude. As described before, flip-flops D11 to D41, D12 to D42, D13 to D43, and D14 to D44 which are triggered at the rising edge in the frequency division module 32, are mutually connected to form a ½ frequency divider; resets rst of flip-flops D11 to D41 are all controlled by reset signal R0, and can be taken as one set. Flip-flops D11 to D41 divide the frequency of the intermediate clocks y0 to y3 so as to generate output clocks A0 to A3. Similarly, the set of flip-flops D12 to D42 controlled by reset signal R1 divide the frequency of the intermediate clocks y4 to y7 to generate output clocks A4 to A7; the set of flip-flops D13 to D43 controlled by reset signal R2 divide the frequency of the intermediate clocks y8 to y11 to generate output clocks A8 to A11. Flip-flops D14 to D44 are similar. FIG. 10A shows the time sequence of the relative signals of flip-flops D11 to D41, D12 to D42. Frequencies of the intermediate clocks y0 to y3 generated by the flip-flops F11, F21, F31 and F41 (these are the first stages of the flip-flops in each set) in FIG. 9A to FIG. 9D are what flip-flops D11 to D41 will divide. As previously described, the intermediate clocks of flip-flops in the sequence triggering module 30, which are seen as one set, have the correct phase relationship, but those intermediate clocks of different sets of flip-flops do not necessarily have the correct relative phase relationship. As shown in FIG. 10A, rising edges of the first periods of intermediate clocks y0 to y3 are at ta2, tb2, tc2, td2, but the rising edge of the first period of the intermediate clock y3 at td2 will lead that of the intermediate clock y0 at ta2 because they are affected by reset time ts in sequence triggering module 30 (please refer to the discussion about FIG. 9D). If the frequency division is triggered by the rising edge of the time point td2, the time sequence of the output clock A3 is not correct. However, reset signal R0 will force the flip-flops D11 to D41 to reset at the rising edge of reset signal R0. This means flip-flops D1 to D41 will be triggered to do frequency division after time point ta1. Because flip-flops D1 to D41 are triggered at the rising edge flip-flop D41 will do frequency division at the rising edge of the intermediate clock y3 at time point td4 after time point ta1 is reset. Therefore, the rising edge of the output clock A3 will be aligned to the rising edge of the intermediate clock y3, and have a desired phase difference from A0, as shown in FIG. 6A. In fact, because the reset time ts does not necessarily have the specified relationship with reference clocks f0 to f7, the rising edge of the first period of the intermediate clocks y1, y2, and y3 will lead that of the intermediate clock y0. Nevertheless, the rising edge of the reset signal R0 produced by the flip-flop F1 and the intermediate clock y0 will lead the rising edge of the first period of the intermediate clock y0 by 180 degrees; and the rising edges of the first periods of the intermediate clocks y1 to y3 will lead that of the intermediate clock y0 by 225 degrees to 315 degrees (45 degrees to 135 degrees of the phase difference between the reference clocks f1 to f3 and the reference clock f0). In other words, even when some rising edges of the first periods of the intermediate clocks y1 to y3 lead that of the intermediate clock y0, the rising edge of the reset signal R0 must lag them so that flip-flops D21 to D41 will not do frequency division at rising edges of the first periods of the intermediate clocks y1 to y3, which lead the rising edge of the first period of the intermediate clock y0, and will operate until the rising edge of the reset signal R0 appears. Thus, frequency division will be triggered in sequence after time ta2 according to the intermediate clocks y1 to y3 satisfying the expected phase difference based on the rising edge at time ta2 of the intermediate clock y0. Therefore, the output clocks of the frequency division A0 to A4 will have the expected phase difference.

Similarly, the reset signal R1 produced by the flip-flop F12 and the intermediate clock y4 will neglect the time point td3. The rising edge of the first period of the intermediate clock y7 and the frequency division will be triggered correctly in flip-flops D12 to D42 by the rising edges of the intermediate clocks y5 to y7 after the lag time ta3 (that is, the rising edge of the first period of the intermediate clock y4). Thus, output clocks A4 to A7 are generated. Please note that in the sequence triggering module 30, the intermediate clock y4 is generated by the second stage of the flip-flop F12 and the rising edge of the first period of it must lag the intermediate clock y0 generated by the first stage of the flip-flop F11. If the operation of the reset signal R1 in flip-flops D22 to D42 is included, it is certain that the intermediate clocks y0 to y7 must start frequency division after the rising edge of the first period of the intermediate clock y0.

As shown in FIG. 10B, the reset signal R2 produced by the flip-flop F13 and the intermediate clock y8 will neglect the time point td4. The rising edge of the first period of the intermediate clock y11 and the frequency division will be triggered correctly in flip-flops D13 to D43 by the rising edges of the intermediate clocks y8 to y11 at the time points ta5, tb5, tc5, and td7 to get the output clocks A8 to A11. Similarly, the flip-flops D14 to D44 will be triggered to divide frequencies correctly according to the reset signal R3 and the intermediate clocks y12 to y15 at the rising edges of the time points ta5, tb5, tc5 and td5 to get output clocks A12 and A15.

In summary, the phase interpolator 28 of the present invention uses each set of 30 flip-flops F11 to F14, F21 to F24, F31 to F34, and F41 to F44 in the sequence triggering module 30 to generate the intermediate clocks. The rising edge of the first period of the intermediate clock y0 is taken as the basis and the rising edges of the first periods of the intermediate clocks y4, y8, and y12 produced by flip-flops F12 to F14 are made to lag that of the intermediate clock y0 by the correct phase difference. Similarly, the rising edges of the first periods of the intermediate clocks y5, y9, and y13 produced by flip-flops F21 to F41 lag that of the intermediate clock y1 by the correct phase difference. The other flip-flops operate similarly. If the reset signal R0 produced by flip-flops F11 to F14 is included in the operation, the flip-flops D11 to D14 in the frequency division module 32 insure that the intermediate clocks y0 to y3 generated by the different sets of the flip-flops F11 to F41 in the sequence triggering module 30 will trigger frequency division at the correct rising edges and generate the output clocks A0 to A3. Similarly, in the flip-flops D12 to D42, the intermediate clocks y5 to y7 will cooperate with the reset signal R1 corresponding to the intermediate clock y4 and trigger frequency division by each rising edge, which lags the rising edge of the first period of the intermediate clock y4. In the flip-flops D13 to D43, the intermediate clocks y8 to y11 will cooperate with the reset signal R2 corresponding to the intermediate clock y8 and trigger frequency division by each rising edge, which lags the rising edge of the first period of the intermediate clock y8. In the flip-flops D14 to D44, the intermediate clocks y12 to y15 will cooperate with the reset signal R3 corresponding to the intermediate clock y12 and trigger frequency division by each rising edge, which lags the rising edge of the first period of the intermediate clock y12. Because the rising edges of the first periods of each intermediate clock y0, y4, y8, and y12 have the determined phase relationship in the flip-flops F11 to F14 of the sequence triggering module, the intermediate clocks y0, y4, y8 and y12 in each set of flip-flops D11 to D14, D12 to D42, D13 to D43 and D14 to D44 will insure that other rising edges of the intermediate clocks have the desired phase difference from the rising edge of the first period of the intermediate clock y0 when triggering frequency division and correctly generate the output clocks A0 to A15.

Figure 11A:
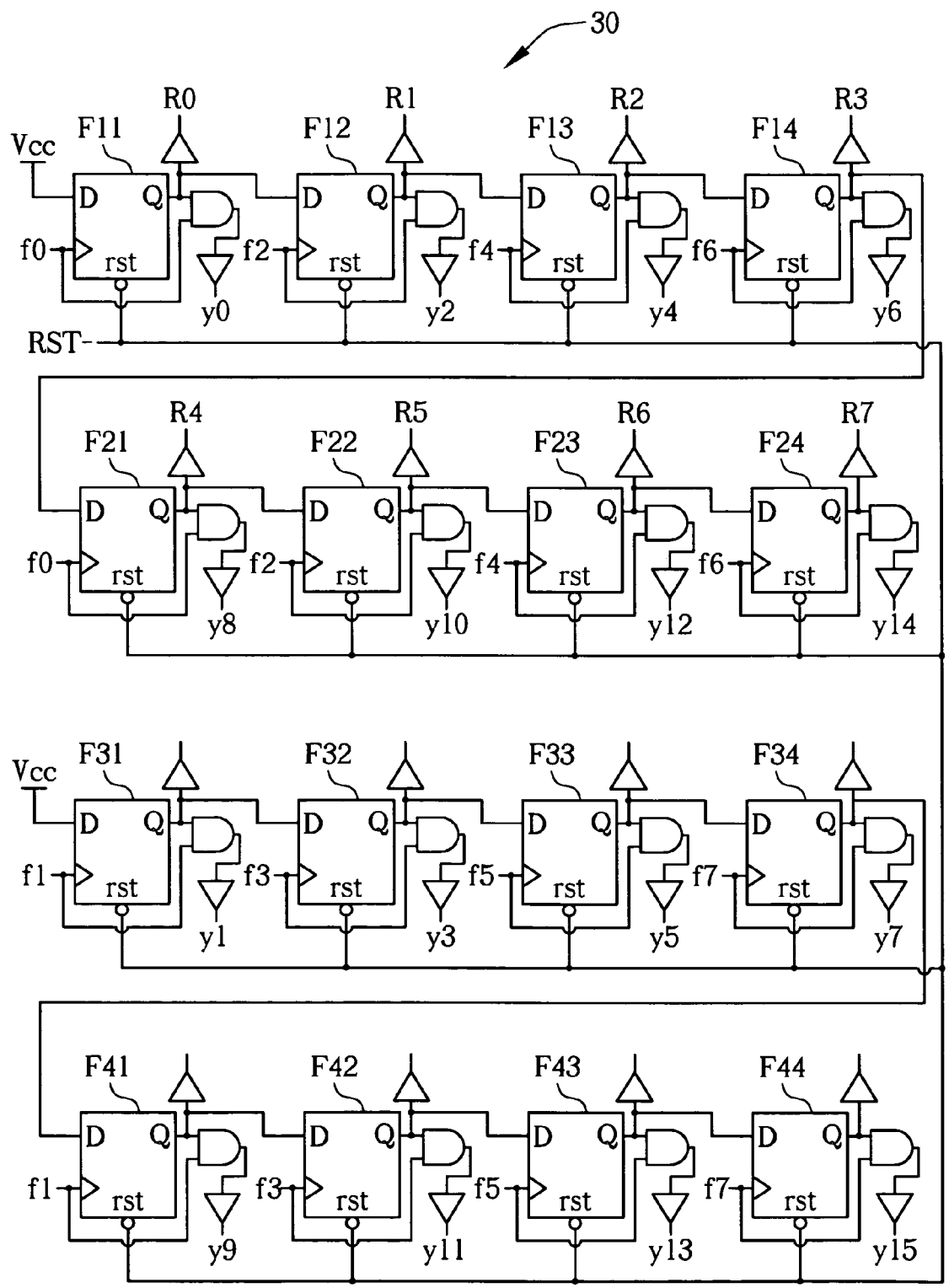
FIG. 11A illustrates another example of the sequence triggering module of FIG. 5.
Figure 11B:
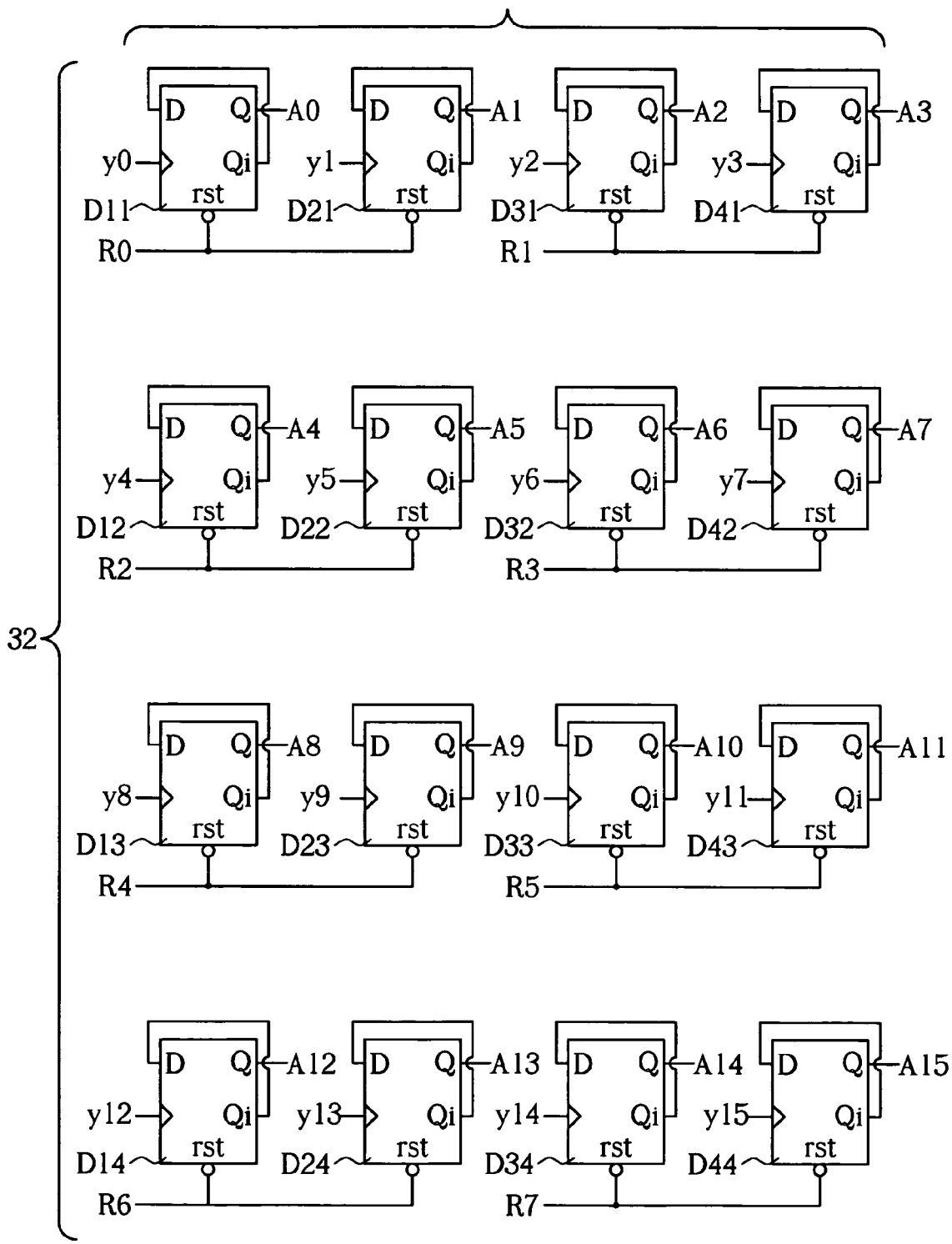
FIG. 11B illustrates another example of the frequency division module of FIG. 5.

Please refer to the FIG. 11A, and FIG. 11B. The operational principles of the phase interpolator 28 in this invention are described, but the phase interpolator can also be implemented by another way. For example, FIG. 11A and 11B show the circuits of another method of implementing the sequence triggering module 30 and the frequency division module 32 in the phase interpolator 28. As shown in FIG. 11A, the sequence triggering module 30 can generate each intermediate clock and reset signals by two sets of flip-flops. In the module 30, the flip-flops F11 to F14 and F21 to F24 belong to one set. The flip-flop F11 receives a digital "1" at the input D and other flip-flops receive the output of the previous stages of the flip-flops as the inputs (please note that the flip-flop F21 receives the output Q of the flip-flop F14). They generate the intermediate clocks y0, y2, y4, y6, y8, y10, y12, and y14, as well as the reset signals R0 to R7 when triggered by the reference clocks f0, f2, f4, f6, f0, f2, f4, f4. The other sets of flip-flops F31 to F34 and F41 to F44 also receive the output of the previous stages of the flip-flops as the inputs (for example, the flip-flop F41 receive the output of the flip-flop F34, and the flip-flop F31 receives a digital "1" as input). They generate the intermediate clocks y1, y3, y5, y7, y9, y11, y13, and y15 when triggered by the reference clocks f1, f3, f5, f7, f1, f3, f5, f7. The rising edges of the first periods of the 8 intermediate clocks generated by the flip-flops have the expected phase difference between one another. As for the time sequence of different sets of intermediate clocks, flip-flops D1 to D41, D12 to D41, D13 to D43 and D14 to D44 connected for the ½ frequency divider in FIG. 11B will be aligned by reset signal R0 to R7. For example, both flip-flops D1 and D21 are controlled by reset signals R0, so even if the rising edge of the first period of the intermediate clock y1 leads that of the intermediate clock y0, the reset signal R0 will trigger frequency division in the flip-flop D21 at the rising edge of the next period of the intermediate clock y1 and generate the correct output clock A1. Operational principles of the other flip-flops can be deduced by those skilled in the art and will not be discussed further. Of course, through proper modification of the invention, the flip-flops can be triggered by the falling edges instead of the rising edges in the frequency division module. The key point is to trigger frequency division at the correct time points by different intermediate clocks.

Because the outputs Q of 8 flip-flops are connected serially one by one (such as flip-flops F1 to F24) as shown in FIG. 11A, the gate delay of each and gate and flip-flop should be shorter than ¼ period of the reference clocks f0 to f7. In the example of FIG. 7, there are merely four flip-flops (flip-flops F11, F12, F13, and F14) connected serially, allowing the present invention to be suitable for high-frequency applications.

In summary, the present invention takes advantage of different reference periods of double-frequency reference clocks to trigger frequency division and generate phase-splitting output clocks. Generally speaking, to generate M output clocks with different phases but the same frequency f, N reference clocks of the frequency (M/N)*f with different phases are generated first in this invention (in this case, M>N), and then frequency division of N/M is triggered by different periods (every N−1 period) of each reference clock so that M/N output clocks with different phases are generated in each reference clock and finally M output clocks of different phases are produced by N reference clocks. Like the example discussed before, 16 output clocks of 16 split phases are generated (M=16) by the following steps: first, 8 reference clocks of double frequency are generated by a ring oscillator comprising four stages of inverters (N=8; M/N=2); second, in the phase interpolator ½ frequency division is triggered by adjacent two periods of each reference clock (these are two intermediate clocks generated by a reference clock); finally, 16 output clocks of the targeted frequency with different phases are generated. Of course, this invention can use a ring oscillator comprising 2 stages of inverters to produce 4 reference clocks of four frequencies (N=4; M/N=4). In this case, in the phase interpolator, ¼ frequency division is triggered by adjacent four periods of each reference clock and finally, 16 output clocks of the targeted frequency with different phases are generated.

Figure 1:
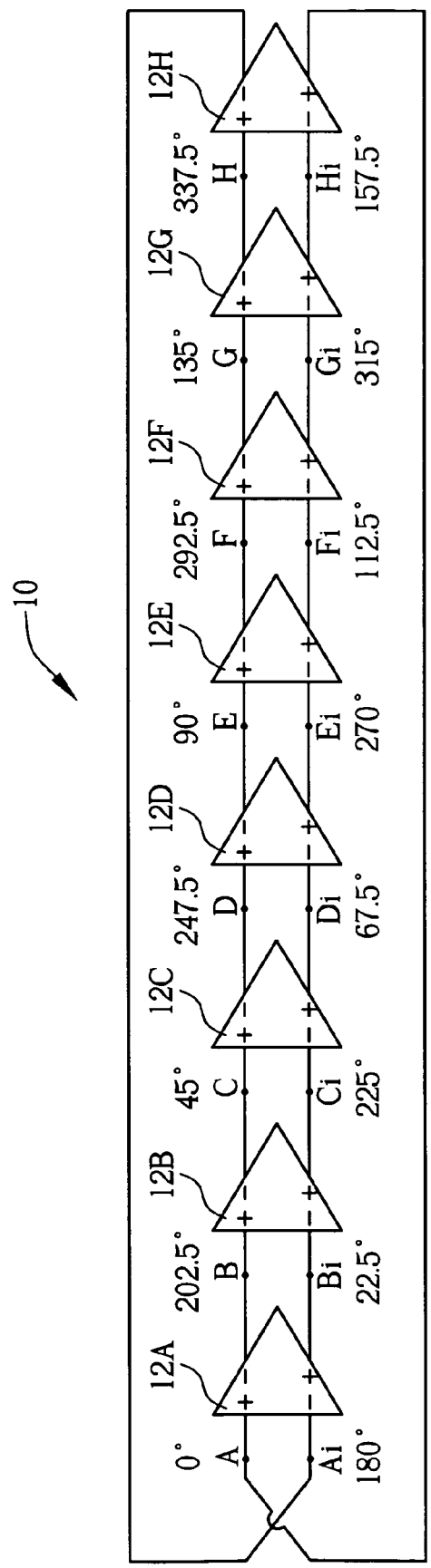
FIG. 1 illustrates a conventional ring oscillator.
Figure 2:
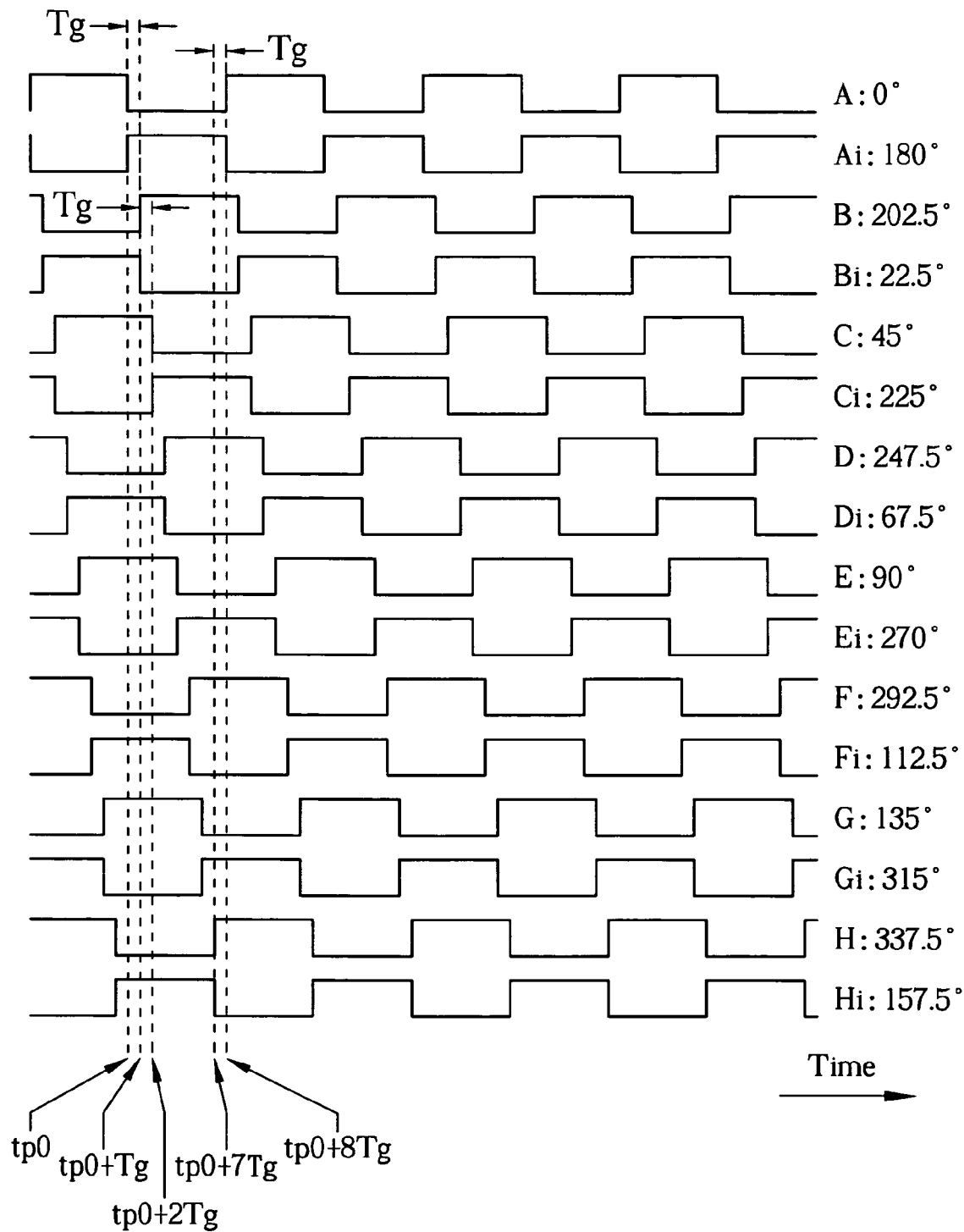
FIG. 2 and FIG. 3 illustrate waveform timing diagrams of each output clock of the same frequency but different phases in a conventional ring oscillator.
Figure 3:
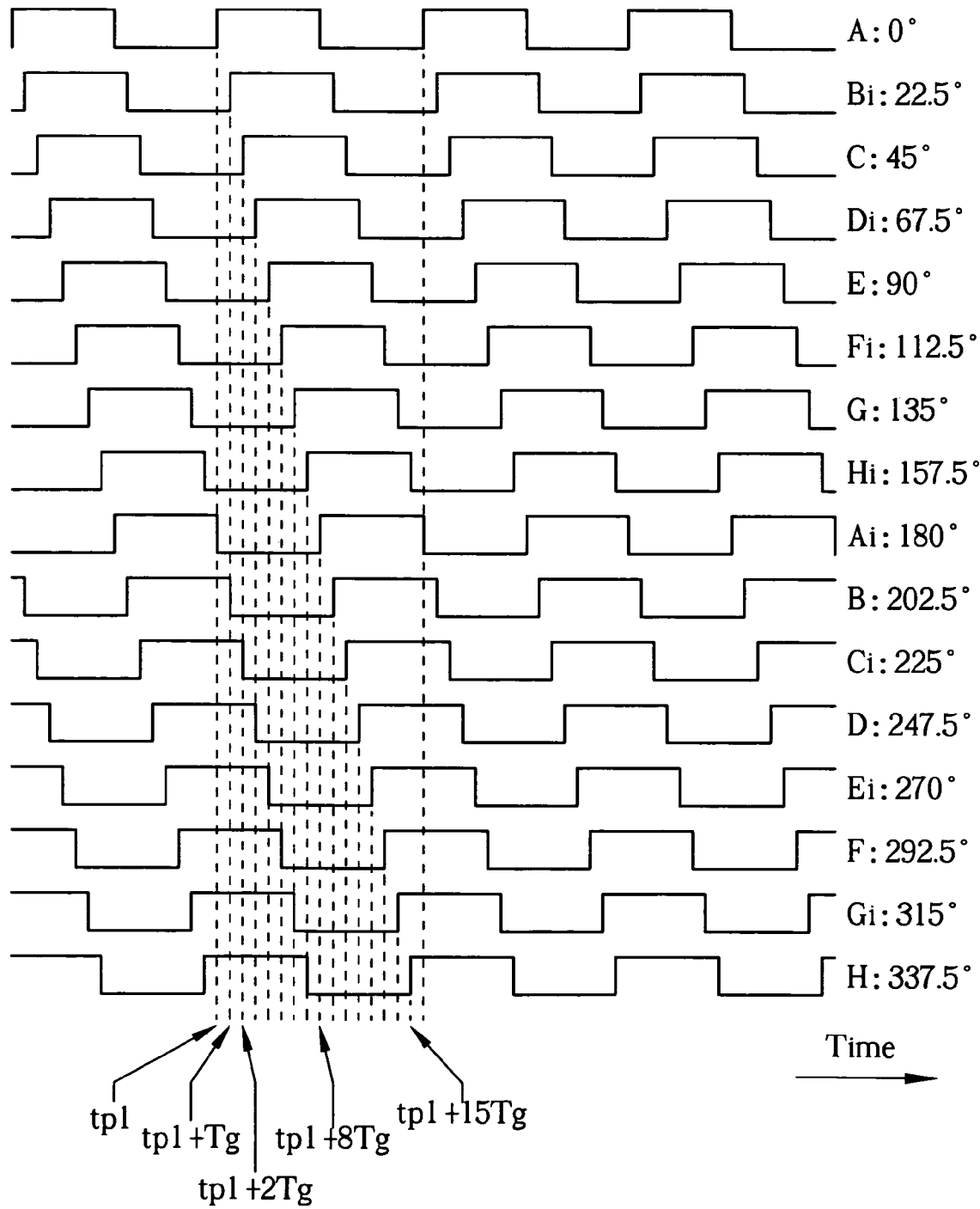
Figure 4:
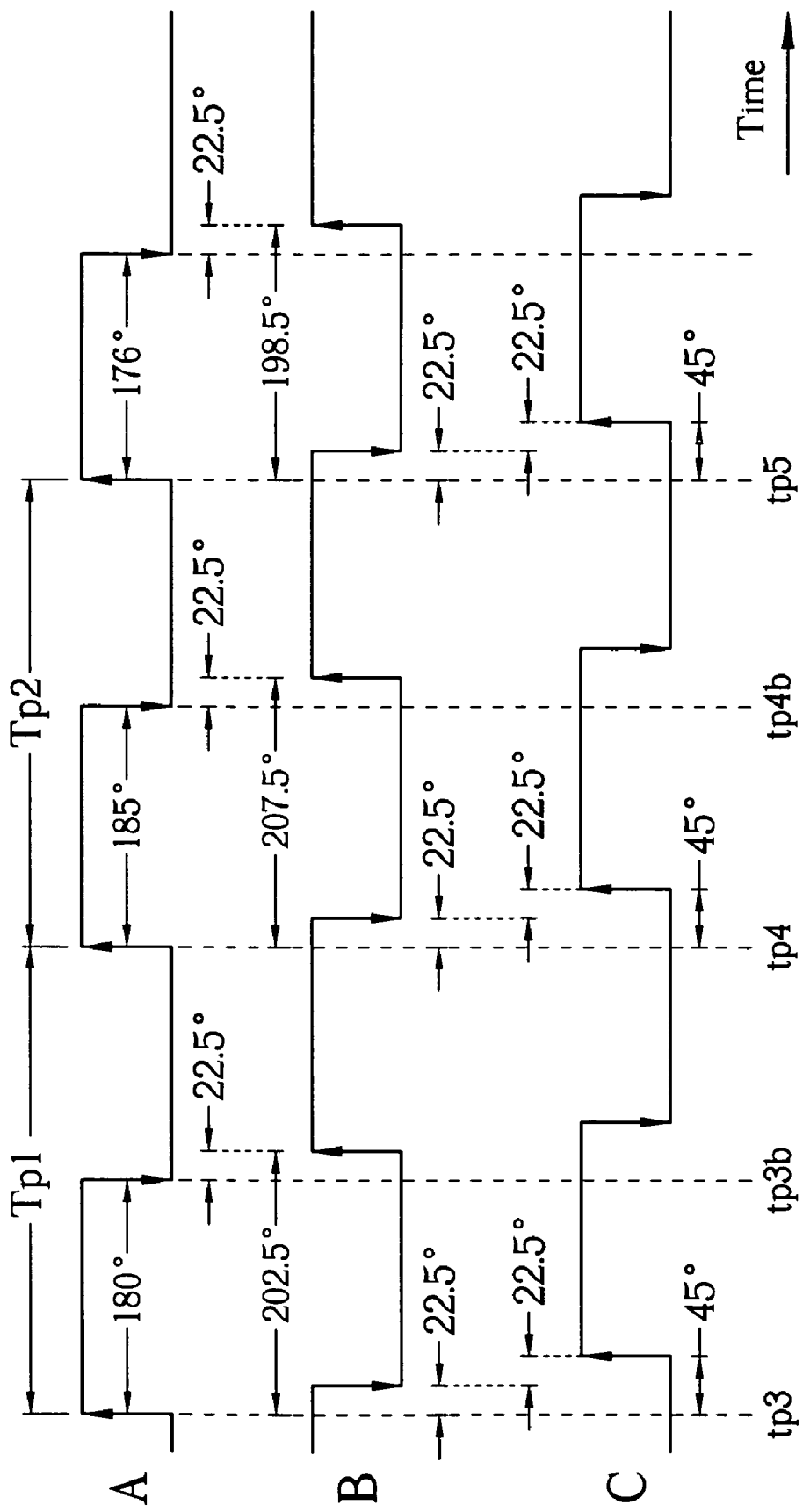
FIG. 4 illustrates the waveform timing diagrams of distorted output signals in a conventional ring oscillator.

In the prior art, ring oscillators having M/2 stages of inverters are required to generate M output clocks of the same frequency but with split phases. As discussed before, in the prior art, ring oscillators consisting of 8 stages of inverters are required to generate 16 phase-split output clocks of the same frequency. However, the ring oscillator itself is a unstable feedback system, and the more serial inverters a ring oscillator includes, the more noise this unstable feedback system will produce. In addition, more inverters limit the speed of the circuits to not generate clocks of higher frequency, and power consumption of these circuits becomes larger and heat dissipation will also be a problem. Moreover, each stage of the inverters in a ring oscillator will trigger the next stage of the inverters by rising edges and falling edges, which possibly produces jitter in signals due to incorrect clock periods, causing incorrect phase-splitting and leading to nonlinear error in a time-digit converter. Comparatively, the present invention takes advantage of a phase interpolator to assist the ring oscillators. Thus, reference clocks are generated by the ring oscillator with fewer stages of inverters and the phase interpolator interpolates the phases to generate the expected phase-split output clocks. As in the example discussed before, if the 16 phase-split output clocks are generated, in this invention 8 reference clocks are produced first by the ring oscillator comprising 4 stages of inverters; then, 16 output clocks are interpolated by each reference clock to complete phase splitting. Because fewer inverters are needed ring oscillator according to the present invention, noise and loading of the entire circuit will be smaller. Ring oscillators can generate better reference clocks, resulting in output clocks generated by the phase interpolator being improved (less jitter, more precise clock periods). In addition, the phase interpolator of the present invention is triggered to produce output clocks by the different rising edges of each reference clock, so even if the period of each output clock has some distortion, the phase is split precisely by the rising edges of each output clock to apply to the time sequence control of high precision (as shown in FIG. 3). When this invention is applied to a time-digit converter, the nonlinear error can be greatly reduced. The present invention can be used widely for time-digit converters, time-delay circuits, or the control mechanisms of a CD-ROM drive to control the time sequence of the input or output data precisely.

Those skilled in the art will readily observe that numerous modifications and alterations of the device may be made while retaining the teachings of the invention. Accordingly, the above disclosure should be construed as limited only by the metes and bounds of the appended claims.

The invention claimed is:

1. A method of phase splitting for generating multi-phase clocks having the same frequency and predetermined phase differences between one another, comprising:
   a plurality of reference clocks each generating an output of a first frequency having a first phase difference from other reference clocks;
   for each of the plurality of reference clocks, utilizing a plurality of periods in the output of a single reference clock to generate a plurality of output clocks each having a second frequency at a second phase difference from other output clocks generated by said single reference clock, each period of the second frequency being equal to the sum of the plurality of periods utilized in the output of said single reference clock wherein the first phase difference is a multiple of the second phase difference;
   determining a first reference period of a first reference clock of the plurality of reference clocks;
   finding a first reference period in a second reference clock of the plurality of reference clocks lagging the first reference period of the first reference clock;
   dividing the frequency of the first reference clock at a time point corresponding to the first reference period of the first reference clock in order to generate an output clock; and
   dividing the frequency of the second reference clock at a time point corresponding to the first reference period of the second reference clock in order to generate another output clock.

2. The method of claim 1 wherein the first frequency is a multiple of the second frequency.

3. The method of claim 1 wherein a ratio of the first phase difference to the second phase difference is the same as a ratio of the plurality of reference clocks to the plurality of output clocks.

4. The method of claim 1 wherein when the first frequency is N times the second frequency, the method further comprises triggering periods of the second frequency according to the plurality of periods utilized in the output of one of the reference clocks at intervals of at least (N−1) period.

5. The method of claim 1 wherein if the output of two reference clocks have the first phase difference of 360 degrees, the two reference clocks are essentially the same, and when using the two reference clocks to generate two corresponding output clocks, the two corresponding output clocks are triggered by different periods of one reference clock.

6. The method of claim 1 wherein the first reference clock leads the second reference clock by the first phase difference.

7. The method of claim 1 wherein the periods of each output clock are triggered by reference periods of a corresponding reference clock apart from other reference clocks by at least one or a plurality of periods of the corresponding reference clock wherein if a first period of one of the output clocks is triggered by a first reference period of a corresponding reference clock, a second period of said one of the output clocks would be triggered by a reference period lagging the first reference period by the first phase difference in a second reference clock, the second period of said one of the output clocks lagging the first period of said one of the output clocks by the second phase difference.

8. The method of claim 1 wherein two reference clocks are a third reference clock and a fourth reference clock, the method further comprising:
   selecting a first reference period in the third reference clock;
   in the fourth reference clock, stopping a reference period lagging the first reference period to generate a corresponding intermediate clock so that each reference period of the corresponding intermediate clock will lag the first reference period in the third reference clock; and
   dividing the frequency of the third reference clock and the corresponding intermediate clock to generate two corresponding output clocks.

9. A multi-phase clock-generating circuit for generating two output clocks of the same frequency with a predetermined phase difference between each other, comprising:
   a clock generator for generating two reference clocks having a same frequency that is a multiple greater than 1 of the frequency of the two output clocks, the two reference clocks having a predetermined reference phase difference between each other;
   a phase interpolator for generating two corresponding output clocks wherein each period of these two output clocks is triggered by a corresponding reference period of one of the two reference clocks, which is apart from other reference periods of said one of the two reference clocks by at least one or a plurality of periods of said one of the two reference clocks;
   a sequence triggering module for stopping a reference period of a second reference clock of said two reference clocks lagging a first reference period of a first reference clock of said two reference clocks to generate a corresponding intermediate clock; and a frequency division module for dividing the frequency of the first reference clock and the corresponding intermediate clock to generate two corresponding output clocks;

wherein each reference period of the corresponding intermediate clock lags the first reference period of the first reference clock.

10. The multi-phase clock-generating circuit of claim 9 wherein the first reference clock leads the second reference clock by the predetermined reference phase difference.

11. The multi-phase clock-generating circuit of claim 9 wherein two reference clocks are a first reference clock and a second reference clock, and the phase interpolator comprises:

a sequence triggering module for finding in the second reference clock a first reference period lagging a first reference period of the first reference clock, and producing a corresponding reset signal at a time corresponding to the first reference period of the second reference clock;

a first frequency divider for generating an output clock by dividing the frequency of the first reference clock; and a second frequency divider for generating the other output clock by dividing the frequency of the second reference clock after receiving the corresponding reset signal.

12. The multi-phase clock-generating circuit of claim 11 wherein the first frequency divider and the second frequency divider are triggered by rising edges of the first and second reference clocks respectively.

13. The multi-phase clock-generating circuit of claim 9 wherein the frequency of the reference clocks is a multiple of the frequency of the output clocks.

14. The multi-phase clock-generating circuit of claim 9 wherein the predetermined reference phase difference is plural times an output phase difference between outputs of the output clocks, and a ratio of the predetermined reference phase difference to the output phase difference is the same as a ratio of the frequency of the two reference clocks to the frequency of the output clocks.

15. A method of phase-splitting for generating two output clocks of the same frequency with a predetermined phase difference between each other, comprising:

generating a first reference clock having a frequency that is a multiple greater than 1 of a frequency of a corresponding output clock, a period of the corresponding output clock being substantially equal to an integer multiple of a reference period of the first reference clock;

triggering periods of different said two output clocks by the reference period of the corresponding reference clock to generate the two output clocks;

generating a second reference clock having the same clock frequency but a different phase as the first reference clock; and triggering each period of a third output clock according to each period of the second reference clock;

wherein output of the third output clock is of the same frequency as said two output clocks and has the predetermined phase difference from said two output clocks.

16. The method of claim 15 wherein the predetermined phase difference of the two output clocks is between 0 and 360 degrees.

17. The method of claim 15 wherein the predetermined phase difference of the two output clocks is between 0 and 180 degrees or between 180 and 360 degrees.

18. The method of claim 15 wherein if the frequency of the reference clock is N times that of the corresponding output clock, the predetermined phase difference of the two output clocks is a multiple of 360/N degrees.

19. The method of claim 15 wherein frequency division is triggered by the reference period of the first reference clock to generate an output clock, a second reference period lagging the reference period of the first reference clock starting frequency division to generate another output clock.

* * * * *